(12) United States Patent
Yamazaki et al.

(10) Patent No.: US 8,551,824 B2
(45) Date of Patent: Oct. 8, 2013

(54) METHOD FOR MANUFACTURING SEMICONDUCTOR DEVICE

(75) Inventors: Shunpei Yamazaki, Setagaya (JP); Junichi Koezuka, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 127 days.

(21) Appl. No.: 13/029,148

(22) Filed: Feb. 17, 2011

(65) Prior Publication Data

US 2011/0212569 A1    Sep. 1, 2011

(30) Foreign Application Priority Data

Feb. 26, 2010   (JP) .................... 2010-042024

(51) Int. Cl.
*H01L 21/84* (2006.01)
*H01L 21/00* (2006.01)
*H01L 21/331* (2006.01)
*H01L 21/322* (2006.01)

(52) U.S. Cl.
USPC ........... 438/149; 438/151; 438/161; 438/164; 438/370; 438/473; 257/E21.372; 257/E21.411; 257/E21.476

(58) Field of Classification Search
USPC ................ 257/E21.372, E21.411, E21.476
See application file for complete search history.

(56) References Cited

U.S. PATENT DOCUMENTS

| | | |
|---|---|---|
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,151,015 B2 | 12/2006 | Suzawa et al. |
| 7,211,825 B2 | 5/2007 | Shih et al. |

(Continued)

FOREIGN PATENT DOCUMENTS

| | | |
|---|---|---|
| EP | 1737044 A | 12/2006 |
| EP | 2226847 A | 9/2010 |

(Continued)

OTHER PUBLICATIONS

Fortunato.E et al., "Wide-Bandgap High-Mobility ZNO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Mohsen Ahmadi
(74) *Attorney, Agent, or Firm* — Eric J. Robinson; Robinson Intellectual Property Law Office, P.C.

(57) ABSTRACT

In a transistor including an oxide semiconductor layer, an oxide insulating layer is formed so as to be in contact with the oxide semiconductor layer. Then, oxygen is introduced (added) to the oxide semiconductor layer through the oxide insulating layer, and heat treatment is performed. Through these steps of oxygen introduction and heat treatment, impurities such as hydrogen, moisture, a hydroxyl group, or hydride are intentionally removed from the oxide semiconductor layer, so that the oxide semiconductor layer is highly purified.

17 Claims, 14 Drawing Sheets

(56) References Cited

U.S. PATENT DOCUMENTS

| | | | |
|---|---|---|---|
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,705,358 B2 | 4/2010 | Okamoto et al. | |
| 7,732,819 B2 | 6/2010 | Akimoto et al. | |
| 7,749,825 B2 | 7/2010 | Honda | |
| 7,791,072 B2 | 9/2010 | Kumomi et al. | |
| 8,012,794 B2 | 9/2011 | Ye | |
| 8,101,949 B2 | 1/2012 | Ye | |
| 8,129,719 B2 * | 3/2012 | Yamazaki et al. | 257/43 |
| 8,222,098 B2 | 7/2012 | Honda | |
| 8,258,511 B2 | 9/2012 | Ye | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 * | 12/2008 | Ryu et al. | 257/43 |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0142887 A1 | 6/2009 | Son et al. | |
| 2009/0152506 A1 | 6/2009 | Umeda et al. | |
| 2009/0152541 A1 | 6/2009 | Maekawa et al. | |
| 2009/0278122 A1 | 11/2009 | Hosono et al. | |
| 2009/0280600 A1 | 11/2009 | Hosono et al. | |
| 2010/0051937 A1 * | 3/2010 | Kaji et al. | 257/43 |
| 2010/0065844 A1 | 3/2010 | Tokunaga | |
| 2010/0084648 A1 | 4/2010 | Watanabe | |
| 2010/0092800 A1 | 4/2010 | Itagaki et al. | |
| 2010/0109002 A1 | 5/2010 | Itagaki et al. | |
| 2010/0283049 A1 | 11/2010 | Sato et al. | |
| 2011/0003429 A1 * | 1/2011 | Oikawa et al. | 438/104 |
| 2011/0306169 A1 | 12/2011 | Ye | |
| 2012/0097964 A1 | 4/2012 | Honda | |
| 2012/0112186 A1 | 5/2012 | Ye | |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2006-165528 | 6/2006 |
| JP | 2007-134687 A | 5/2007 |
| JP | 2008-060419 A | 3/2008 |
| JP | 2008-281988 A | 11/2008 |
| JP | 2010-040552 A | 2/2010 |
| WO | WO-2004/114391 | 12/2004 |
| WO | WO-2007/043493 | 4/2007 |
| WO | WO-2008/126879 | 10/2008 |
| WO | WO-2009/072532 | 6/2009 |
| WO | WO-2010/002608 | 1/2010 |
| WO | WO-2010/002803 | 1/2010 |
| WO | WO-2010/002807 | 1/2010 |

OTHER PUBLICATIONS

Dembo.H et al., "RFCPUS on Glass and Plastic Substrates Fabricated by TFT Transfer Technology,", IEDM 05: Technical Digest of International Elextron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

(56) References Cited

OTHER PUBLICATIONS

Takahashi.M et al., "Theoretical Analysis of IGZO Transparent Amorphous Oxide Semiconductor,", IDW '08: Proceedings of the 15th International Display Workshops, Dec. 3, 2008, pp. 1637-1640.
Hayashi.R et al., "42.1: Invited Paper: Improved Amorphous In-Ga-Zn-O TFTS,", SID Digest '08 : SID International Symposium Digest of Technical Papers, May 20, 2008, vol. 39, pp. 621-624.
Prins.M et al., "A Ferroelectric Transparent Thin-Film Transistor,", Appl. Phys. Lett. (Applied Physics Letters) , Jun. 17, 1996, vol. 68, No. 25, pp. 3650-3652.
Nakamura.M et al., "The phase relations in the In2O3-Ga2ZnO4-ZnO system at 1350°C,", Journal of Solid State Chemistry, Aug. 1, 1991, vol. 93, No. 2, pp. 298-315.
Kimizuka.N. et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System,", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor,", Science, May 23, 2003, vol. 300, No. 5623, pp. 1269-1272.
Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.
Asakuma.N. et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.
Osada.T et al., "15.2: Development of Driver-Integrated Panel using Amorphous In-Ga-Zn-Oxide TFT,", SID Digest '09 : SID International Symposium Digest of Technical Papers, May 31, 2009, pp. 184-187.
Nomura.K et al., "Carrier transport in transparent oxide semiconductor with intrinsic structural randomness probe using single-crystalline InGaO3(ZnO)5 films,", Appl. Phys. Lett. (Applied Physics Letters) , Sep. 13, 2004, vol. 85, No. 11, pp. 1993-1995.
Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.
Son.K et al., "42.4L: Late-News Paper: 4 Inch QVGA Amoled Driven by the Threshold Voltage Controlled Amorphous Gizo (Ga2O3-In2O3-ZnO) TFT,", SID Digest '08 : SID International Symposium Digest of Technical Papers, May 20, 2008, vol. 39, pp. 633-636.
Lee.J et al., "World's Largest (15-Inch) XGA AMLCD Panel Using Igzo Oxide TFT,", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem Oleds,", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.
Tsuda.K et al., "Ultra Low Power Consumption Technologies for Mobile TFT-LCDs ,", IDW '02 : Proceedings of the 9th International Display Workshops, Dec. 4, 2002, pp. 295-298.
Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.
Fung.T et al., "2-D Numerical Simulation of High Performance Amorphous In-Ga-Zn-O TFTs for Flat Panel Displays,", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium-Gallium-Zinc Oxide TFTs Array,", SID Digest '08 : SID International Syposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems,", Journal of Solid-State Circuits , 2008, vol. 43, No. 1, pp. 292-299.
Ohara.H et al., "Amorphous In-Ga-Zn-Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.
Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.
Cho.D et al., "21.2:Al and Sn-Doped Zinc Indium Oxide Thin Film Transistors for AMOLED Back-Plane,", SID Digest '09 : SID International Syposium Digest of Technical Papers, May 31, 2009, pp. 280-283.
Lee.M et al., "15.4:Excellent Performance of Indium-Oxide-Based Thin-Film Transistors by DC Sputtering,", SID Digest '09 : SID International Syposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.
Sakata.J et al., "Development of 4.0-In. AMOLED Display With Driver Circuit Using Amorphous In-Ga-Zn-Oxide TFTS,", IDW '09 : Proceedings of the 16th International Display Workshops, 2009, pp. 689-692.
Park.J et al., "Amorphous Indium-Gallium-Zinc Oxide TFTS and Their Application for Large Size AMOLED,", AM-FPD '08 Digest of Technical Papers, Jul. 2, 2008, pp. 275-278.
Park.S et al., "Challenge to Future Displays: Transparent AM-Oled Driven by Peald Grown ZNO TFT,", IMID '07 Digest, 2007, pp. 1249-1252.
Godo.H et al., "Temperature Dependence of Characteristics and Electronic Structure for Amorphous IN-GA-ZN-Oxide TFT,", AM-FPD '09 Digest of Technical Papers, Jul. 1, 2009, pp. 41-44.
Osada.T et al., "Development of Driver-Integrated Panel Using Amorphous IN-GA-ZN-Oxide TFT,", AM-FPD '09 Digest of Technical Papers, Jul. 1, 2009, pp. 33-36.
Hirao.T et al., "Novel Top-Gate Zinc Oxide Thin-Film Transistors (ZNO TFTS) for AMLCDS,", Journal of the SID, 2007, vol. 15, No. 1, pp. 17-22.
Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous IN-GA-ZN-Oxide TFT,", SID Digest '09 : SID International Symposium Digest of Technical Papers, May 31, 2009, pp. 1110-1112.
Ohara.H et al., "21.3:4.0 In. QVGA AMOLED Display Using IN-GA-ZN-Oxide TFTS With a Novel Passivation Layer,", SID Digest '09 : SID International Symposium Digest of Technical Papers, May 31, 2009, pp. 284-287.
Miyasaka.M, "Suftla Flexible Microelectronics on Their Way to Business,", SID Digest '07 : SID International Symposium Digest of Technical Papers, 2007, vol. 38, pp. 1673-1676.
Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.
Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.
Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

(56) References Cited

OTHER PUBLICATIONS

Lee.H et al., "Current Status of, Challenges to, and Perspective View of AM-OLED,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", Nirim Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N. et al., "Spinel,YBFE2O4, and YB2FE3O7 Types of Structures for Compounds in the IN2O3 and SC2O3-A2O3-BO Systems [A; FE, GA, OR AL; B: MG, MN, FE, NI, CU, OR ZN] at Temperatures Over 1000° C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics), 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor Upon Exposure to Water,", Appl. Phys. Lett. (Applied Physics Letters), 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters), 2005, vol. 87, pp. 122102-1-122102-3.

Oba.F et al., "Defect energetics in ZnO: A hybrid Hartree-Fock density functional study,", Phys. Rev. B.(Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using Castep,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

International Search Report (Application No. PCT/JP2011/052198) Dated Mar. 29, 2011.

Written Opinion (Application No. PCT/JP2011/052198) Dated Mar. 29, 2011.

* cited by examiner

METHOD FOR MANUFACTURING SEMICONDUCTOR DEVICE

TECHNICAL FIELD

The present invention relates to a semiconductor device and a method for manufacturing a semiconductor device.

In this specification, a semiconductor device generally means a device which can function by utilizing semiconductor characteristics, and an electro-optic device, a semiconductor circuit, and an electronic device are all semiconductor devices.

BACKGROUND ART

Attention has been focused on a technique for forming a transistor using a semiconductor thin film formed over a substrate having an insulating surface (also referred to as a thin film transistor (TFT)). The transistor is applied to a wide range of electronic devices such as an integrated circuit (IC) or an image display device (display device). A silicon-based semiconductor material is widely known as a material for a semiconductor thin film applicable to a transistor. As another material, an oxide semiconductor has been attracting attention.

For example, a transistor whose active layer uses an amorphous oxide containing indium (In), gallium (Ga), and zinc (Zn) and having an electron carrier concentration of less than $10^{18}/cm^3$ is disclosed (see Patent Document 1).

REFERENCE

[Patent Document 1] Japanese Published Patent Application No. 2006-165528

DISCLOSURE OF INVENTION

However, the electrical conductivity of an oxide semiconductor changes when deviation from stoichiometric composition due to excess or deficiency of oxygen or the like occurs, or hydrogen or moisture included in an electron donor enters the oxide semiconductor during a thin film formation process. Such a phenomenon becomes a factor of variation in the electric characteristics of a transistor using the oxide semiconductor.

In view of the above problems, one object is to provide a semiconductor device using an oxide semiconductor, which has stable electric characteristics and high reliability.

In order to suppress variation in the electric characteristics of a thin film transistor including an oxide semiconductor layer, impurities such as hydrogen, moisture, a hydroxyl group, or hydride (also referred to as a hydrogen compound) which cause the variation are intentionally removed from an oxide semiconductor layer. In addition, oxygen which is the major component of an oxide semiconductor and is reduced in the step of removing impurities is supplied. The oxide semiconductor layer is thus highly-purified, whereby the oxide semiconductor layer which is electrically i-type (intrinsic) is obtained.

An i-type (intrinsic) oxide semiconductor is an oxide semiconductor which is intrinsic or is extremely close to being intrinsic. The i-type (intrinsic) oxide semiconductor is obtained in such a manner that hydrogen, which is an n-type impurity, is removed from an oxide semiconductor, and the oxide semiconductor is highly purified to contain as few impurities as possible. That is, the oxide semiconductor has a feature in that it is made to be an i-type (intrinsic) oxide semiconductor or made to be close thereto by being highly purified by removal of impurities such as hydrogen or water as much as possible. This enables the Fermi level ($E_f$) to be at the same level as the intrinsic Fermi level ($E_i$).

In a transistor including an oxide semiconductor layer, an oxide insulating layer (also referred to as a first insulating layer) is formed so as to be in contact with the oxide semiconductor layer, oxygen is introduced (added) through the oxide insulating layer, and heat treatment is performed. Through these steps of oxygen introduction and heat treatment, impurities such as hydrogen, moisture, a hydroxyl group, or hydride (also referred to as a hydrogen compound) are intentionally removed from the oxide semiconductor layer, whereby the oxide semiconductor layer is highly purified. By introduction of oxygen, a bond between a metal included in the oxide semiconductor and hydrogen or a bond between the metal and a hydroxyl group is cut, and the hydrogen or the hydroxyl group is reacted with oxygen to produce water; this leads to easy elimination of hydrogen or a hydroxyl group that is an impurity, as water by the heat treatment performed later.

Oxygen is introduced to the oxide semiconductor layer through an oxide insulating layer stacked over the oxide semiconductor layer, so that an introduction depth (an introduction region) at which oxygen is introduced can be controlled and thus oxygen can be efficiently introduced to the oxide semiconductor layer.

The oxide semiconductor layer and the oxide insulating layer containing oxygen are in contact with each other when being subjected to the heat treatment; thus, oxygen which is one of the main component of the oxide semiconductor and is reduced in the step of removing impurities, can be supplied from the oxide insulating layer containing oxygen to the oxide semiconductor layer. Thus, the oxide semiconductor layer is more highly purified to become electrically i-type (intrinsic).

In addition, a protective insulating layer (also referred to as a second insulating layer) which prevents impurities such as moisture or hydrogen from entering from the outside is preferably formed over the oxide insulating layer so that these impurities are not included in the oxide semiconductor layer again.

The electric characteristics of a transistor including a highly-purified oxide semiconductor layer, such as the threshold voltage and off-state current, have almost no temperature dependence. Further, transistor characteristics hardly change due to light deterioration.

As described above, variation in the electric characteristics of a transistor including a highly-purified and electrically i-type (intrinsic) oxide semiconductor layer is suppressed and the transistor is electrically stable. Consequently, a semiconductor device using an oxide semiconductor, which has high reliability and stable electric characteristics, can be provided.

The temperature of the heat treatment is 250° C. to 700° C. inclusive, 400° C. to 700° C. inclusive, or lower than the strain point of a substrate. The heat treatment may be performed under an atmosphere of nitrogen, oxygen, ultra-dry air (air in which a water content is 20 ppm or less, preferably 1 ppm or less, more preferably 10 ppb or less), or a rare gas (argon, helium, or the like).

One embodiment of the present invention disclosed in this specification is a method for manufacturing a semiconductor device including the following steps: forming an oxide semiconductor layer; forming a first insulating layer which is an oxide insulating layer so as to be in contact with the oxide semiconductor layer; introducing oxygen to the oxide semiconductor layer through the first insulating layer; performing heat treatment to the first insulating layer and the oxide semiconductor layer; and forming a second insulating layer over the first insulating layer.

Another embodiment of the present invention disclosed in this specification is a method for manufacturing a semiconductor device including the following steps: forming a gate electrode layer over a substrate; forming a gate insulating layer over the gate electrode layer; forming an oxide semiconductor layer over the gate insulating layer; forming a source electrode layer and a drain electrode layer over the oxide semiconductor layer; forming a first insulating layer which is an oxide insulating layer over the oxide semiconductor layer, the source electrode layer, and the drain electrode layer so as to be in contact with the oxide semiconductor layer; introducing oxygen to the oxide semiconductor layer through the first insulating layer; performing heat treatment on the first insulating layer and the oxide semiconductor layer; and forming a second insulating layer over the first insulating layer.

Another embodiment of the present invention disclosed in this specification is a method for manufacturing a semiconductor device including the following steps: forming a source electrode layer and a drain electrode layer over a substrate; forming an oxide semiconductor layer over the source electrode layer and the drain electrode layer; forming a first insulating layer which is an oxide insulating layer so as to be in contact with the oxide semiconductor layer; introducing oxygen to the oxide semiconductor layer through the first insulating layer: performing heat treatment on the first insulating layer and the oxide semiconductor layer; forming a second insulating layer over the first insulating layer; and forming a gate electrode layer over the second insulating layer overlapping with the oxide semiconductor layer.

In the above structures, heat treatment may be performed on the oxide semiconductor layer before the first insulating layer is formed over the oxide semiconductor layer. The oxygen introduction can be performed by an ion implantation method or an ion doping method.

Note that the ordinal numbers such as "first" and "second" in this specification are used for convenience and do not denote the order of steps and the stacking order of layers. In addition, the ordinal numbers in this specification do not denote particular names which specify the present invention.

An oxide insulating layer is formed so as to be in contact with an oxide semiconductor layer. Oxygen is introduced to the oxide semiconductor layer through the oxide insulating layer, and heat treatment is performed. Through these steps of oxygen introduction and heat treatment, impurities such as hydrogen, moisture, a hydroxyl group, or hydride can be intentionally removed from the oxide semiconductor layer, whereby the oxide semiconductor layer can be highly purified. Variation in electric characteristics of a transistor having a highly-purified and electrically i-type (intrinsic) oxide semiconductor layer is suppressed, and the transistor is electrically stable.

Consequently, with one embodiment of the present invention, a transistor having stable electric characteristics can be manufactured.

In addition, with one embodiment of the present invention, a semiconductor device having a transistor with favorable electric characteristics and reliability can be manufactured.

BEST MODE FOR CARRYING OUT THE INVENTION

Hereinafter, embodiments of the present invention will be described in detail with reference to the accompanying drawings. However, the present invention is not limited to the description below, and it is easily understood by those skilled in the art that modes and details disclosed herein can be changed in various ways. In addition, the present invention is not construed as being limited to description of the embodiments shown below.

Embodiment 1

In this embodiment, one embodiment of a semiconductor device and a method for manufacturing the semiconductor device will be described with reference to FIGS. 1A to 1E. In this embodiment, a transistor including an oxide semiconductor layer is shown as an example of the semiconductor device.

Figure 1A:
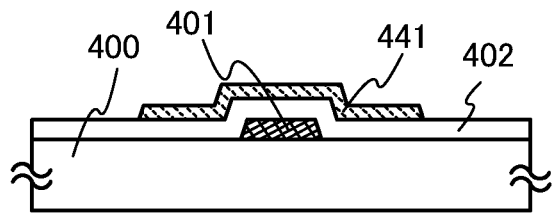
FIGS. 1A to 1E show one embodiment of a semiconductor device and a method for manufacturing the semiconductor device.
Figure 1B:
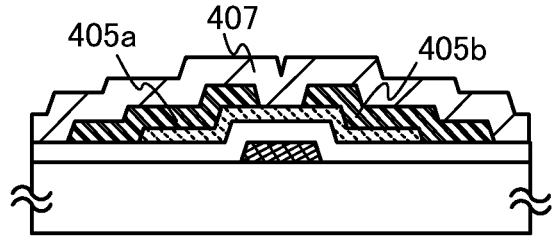
Figure 1C:
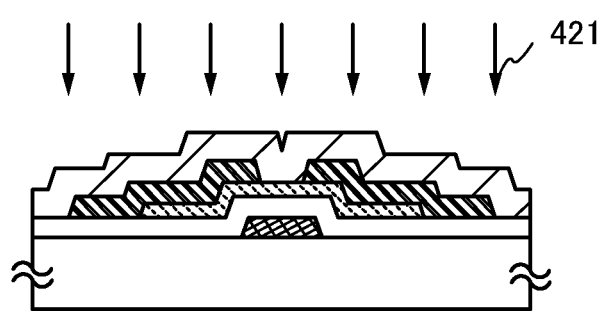
Figure 1D:
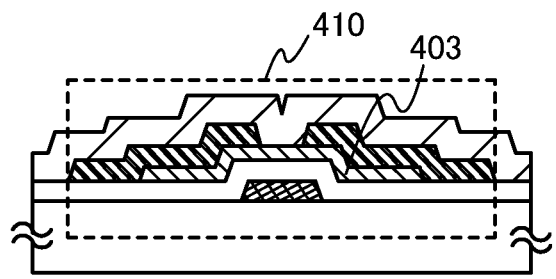
Figure 1E:
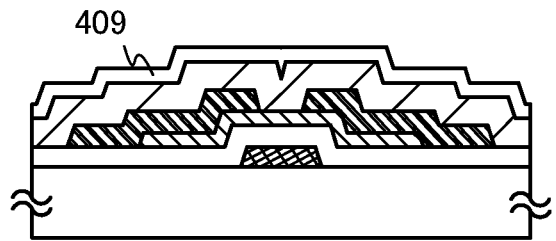

As shown in FIG. 1E, a transistor 410 includes a gate electrode layer 401, a gate insulating layer 402, an oxide semiconductor layer 403, a source electrode layer 405a, and a drain electrode layer 405b, which are formed over a substrate 400 having an insulating surface. An oxide insulating layer 407 (also referred to as a first insulating layer) and a protective insulating layer 409 (also referred to as a second insulating layer) are stacked over the transistor 410 in this order.

FIGS. 1A to 1E show an example of a method for manufacturing the transistor 410.

First, a conductive film is formed over the substrate 400 having an insulating surface, and then, the gate electrode layer 401 is formed in a first photolithography step. Note that a resist mask may be formed by an inkjet method. Formation of the resist mask by an inkjet method needs no photomask; thus, manufacturing cost can be reduced.

Although there is no particular limitation on a substrate used for the substrate 400 having an insulating surface, a glass substrate of barium borosilicate glass, aluminoborosilicate glass, or the like can be used.

The semiconductor device may be manufactured using a flexible substrate as the substrate 400.

In order to manufacture a flexible semiconductor device, the transistor 410 including the oxide semiconductor layer 403 may be directly provided over a flexible substrate. Alternatively, the transistor 410 including the oxide semiconductor layer 403 is provided over a manufacturing substrate, and after that, the transistor 410 may be separated from the manufacturing substrate and transferred to a flexible substrate. Note that in order to separate and transfer a transistor from the manufacturing substrate to a flexible substrate, a separation layer may be provided between the manufacturing substrate and the transistor including an oxide semiconductor layer.

An insulating film serving as a base film may be provided between the substrate 400 and the gate electrode layer 401. The base film has a function of preventing diffusion of an impurity element from the substrate 400, and can be formed with a single-layer structure or a stacked-layer structure using one or more of a silicon nitride film, a silicon oxide film, a silicon nitride oxide film, and a silicon oxynitride film.

The gate electrode layer 401 can be formed to have a single-layer structure or a stacked-layer structure using a metal material such as molybdenum, titanium, tantalum, tungsten, aluminum, copper, neodymium, or scandium, or an alloy material containing any of these materials as its main component.

Next, the gate insulating layer 402 is formed over the gate electrode layer 401. The gate insulating layer 402 can be formed with a single-layer structure or a stacked-layer structure using any of a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, and a hafnium oxide layer by a plasma CVD method, a sputtering method, or the like.

The oxide semiconductor used in this embodiment is an intrinsic (i-type) or substantially intrinsic (i-type) oxide semiconductor, from which impurities are removed and which is highly purified so as to contain impurities that serve as carrier donors and are substances other than the main component of the oxide semiconductor as little as possible.

Such a highly-purified oxide semiconductor is highly sensitive to an interface state and interface charge; thus, an interface between the oxide semiconductor layer and the gate insulating layer is important. For that reason, the gate insulating layer that is to be in contact with a highly-purified oxide semiconductor needs to have high quality.

For example, a high-density plasma CVD method using microwaves (e.g., a frequency of 2.45 GHz) is preferably adopted because an insulating layer which is dense and has high breakdown voltage and high quality can be obtained. The highly-purified oxide semiconductor and the high-quality gate insulating layer are in close contact with each other, whereby the interface state density can be reduced to obtain favorable interface characteristics.

Needless to say, another film formation method such as a sputtering method or a plasma CVD method can be employed as long as the method enables formation of a good-quality insulating layer as a gate insulating layer. Further, an insulating layer whose film quality and characteristic of the interface between the insulating layer and an oxide semiconductor are improved by heat treatment performed after formation of the insulating layer, may be formed as a gate insulating layer. In any case, any insulating layer may be used as long as the insulating layer has characteristics of enabling reduction in interface state density of the interface between the insulating layer and an oxide semiconductor and formation of a favorable interface as well as having favorable film quality as a gate insulating layer.

In order that hydrogen, a hydroxyl group, and moisture might be contained in the gate insulating layer 402 and the oxide semiconductor layer as little as possible, it is preferable that the substrate 400 over which the gate electrode layer 401 is formed or the substrate 400 over which layers up to the gate insulating layer 402 are formed be preheated in a preheating chamber of a sputtering apparatus as pretreatment for film formation of the oxide semiconductor layer so that impurities such as hydrogen and moisture adsorbed to the substrate 400 are eliminated and evacuated. As an exhaustion unit provided in the preheating chamber, a cryopump is preferable. Note that this preheating treatment can be omitted. This preheating may be similarly performed on the substrate 400 over which layers up to a source electrode layer 405a and a drain electrode layer 405b have been formed, before the formation of the oxide insulating layer 407.

Next, over the gate insulating layer 402, an oxide semiconductor layer with a thickness of 2 nm to 200 nm inclusive, preferably 5 nm to 30 nm inclusive is formed.

Note that before the oxide semiconductor layer is formed by a sputtering method, powder substances (also referred to as particles or dust) which are generated at the time of the film formation and attached on a surface of the gate insulating layer 402 are preferably removed by reverse sputtering in which an argon gas is introduced and plasma is generated. The reverse sputtering is a method in which voltage is applied to a substrate side, not to a target side, under an argon atmosphere by using an RF power supply and plasma is generated in the vicinity of the substrate so that a substrate surface is modified. Note that instead of an argon atmosphere, a nitrogen atmosphere, a helium atmosphere, an oxygen atmosphere, or the like may be used.

As an oxide semiconductor used for the oxide semiconductor layer, a four-component metal oxide such as an In—Sn—Ga—Zn—O-based oxide semiconductor; a three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor; a two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, or an In—Mg—O-based oxide semiconductor; an In—O-based oxide semiconductor; a Sn—O-based oxide semiconductor; or a Zn—O-based oxide semiconductor can be used. Further, $SiO_2$ may be contained in the above oxide semiconductor. Note that here, for example, an In—Ga—Zn—O-based oxide semiconductor means an oxide containing indium (In), gallium (Ga), and zinc (Zn), and there is no particular limitation on the stoichiometric proportion thereof. Furthermore, the In—Ga—Zn—O-based oxide semiconductor may contain an element other than In, Ga, and Zn.

For the oxide semiconductor layer, a thin film represented by $InMO_3(ZnO)_m$ (m>0, and m is not a natural number) can be used. Here, M represents one or more metal elements selected from Ga, Al, Mn, and Co. For example, M can be Ga, Ga and Al, Ga and Mn, Ga and Co, or the like.

In this embodiment, the oxide semiconductor layer is formed using an In—Ga—Zn—O-based metal oxide target by a sputtering method. In addition, the oxide semiconductor layer can be formed by a sputtering method under a rare gas (typically, argon) atmosphere, an oxygen atmosphere, or a mixed atmosphere of a rare gas and oxygen.

The target used for formation of the oxide semiconductor layer by a sputtering method is, for example, a metal oxide target having a composition ratio of $In_2O_3:Ga_2O_3:ZnO=1:1:1$ [molar ratio], so that an In—Ga—Zn—O film is formed. Without limitation to the material and the component of the target, for example, a metal oxide target having a composition ratio of $In_2O_3:Ga_2O_3:ZnO=1:1:2$ [molar ratio] may be used.

The fill rate of the metal oxide target is 90% to 100% inclusive, preferably, 95% to 99.9% inclusive. With the use of a metal oxide target with a high fill rate, the formed oxide semiconductor layer can have high density.

It is preferable to use a high-purity gas from which impurities such as hydrogen, water, a hydroxyl group, or hydride are removed as a sputtering gas used when the oxide semiconductor layer is formed.

The substrate is placed in a film formation chamber under reduced pressure, and the substrate temperature is set to 100° C. to 600° C. inclusive, preferably 200° C. to 400° C. inclusive. By heating the substrate during film formation, the concentration of impurities contained in the oxide semiconductor layer formed can be reduced. In addition, damage by sputtering can be reduced. Then, a sputtering gas from which hydrogen and moisture have been removed is introduced into the film formation chamber while moisture remaining therein is removed, and the oxide semiconductor layer is formed over the substrate 400 with the use of the above target. In order to remove the remaining moisture in the film formation chamber, an entrapment vacuum pump, for example, a cryopump, an ion pump, or a titanium sublimation pump is preferably used. As an exhaustion unit, a turbo molecular pump to which a cold trap is added may be used. In the film formation chamber which is evacuated with the cryopump, a hydrogen atom, a compound containing a hydrogen atom, such as water ($H_2O$), (more preferably, also a compound containing a carbon atom), and the like are evacuated, whereby the concentration of impurities contained in the oxide semiconductor layer formed in the film formation chamber can be reduced.

As one example of the film formation condition, the distance between the substrate and the target is 100 mm, the pressure is 0.6 Pa, the direct-current (DC) power source is 0.5 kW, and the atmosphere is an oxygen atmosphere (the proportion of the oxygen flow rate is 100%). Note that a pulse direct current power source is preferable because powder substances (also referred to as particles or dust) generated at the time of the film formation can be reduced and the film thickness can be uniform.

Next, in a second photolithography step, the oxide semiconductor layer is processed into an island-shaped oxide semiconductor layer 441 (see FIG. 1A). A resist mask for forming the island-shaped oxide semiconductor layer 441 may be formed using an inkjet method. Formation of the resist mask by an inkjet method needs no photomask; thus, manufacturing cost can be reduced.

In the case where a contact hole is formed in the gate insulating layer 402, a step of forming the contact hole can be performed at the same time as processing of the oxide semiconductor layer 441.

Note that the etching of the oxide semiconductor layer may be dry etching, wet etching, or both dry etching and wet etching. As an etchant used for wet etching of the oxide semiconductor layer, a solution obtained by mixing phosphoric acid, acetic acid, and nitric acid, an ammonia peroxide mixture (hydrogen peroxide water at 31 wt %:ammonia water at 28 wt %:water=5:2:2), or the like can be used, for example. In addition, ITO07N (produced by KANTO CHEMICAL CO., INC.) may also be used.

Next, a conductive film to be a source electrode layer and a drain electrode layer (including a wiring formed in the same layer as the source electrode layer and the drain electrode layer) is formed over the gate insulating layer 402 and the oxide semiconductor layer 441. As a conductive film used for the source electrode layer and the drain electrode layer, for example, a metal film containing an element selected from Al, Cr, Cu, Ta, Ti, Mo, and W and a metal nitride film containing any of the above elements as its main component (a titanium nitride film, a molybdenum nitride film, and a tungsten nitride film) can be used. A metal film having a high melting point of Ti, Mo, W, or the like or a metal nitride film of any of these elements (a titanium nitride film, a molybdenum nitride film, and a tungsten nitride film) may be stacked on one of or both of a lower side or an upper side of a metal film of Al, Cu, or the like. Alternatively, the conductive film to be the source electrode layer and the drain electrode layer may be formed using a conductive metal oxide. As conductive metal oxide, indium oxide ($In_2O_3$), tin oxide ($SnO_2$), zinc oxide (ZnO), indium oxide-tin oxide alloy ($In_2O_3$—$SnO_2$, which is abbreviated to ITO), indium oxide-zinc oxide alloy ($In_2O_3$—ZnO), or any of these metal oxide materials in which silicon oxide is contained can be used.

A resist mask is formed over the conductive film by a third photolithography step. Etching is selectively performed, so that the source electrode layer 405a and the drain electrode layer 405b are formed. After that, the resist mask is removed.

Light exposure at the time of the formation of the resist mask in the third photolithography step may be performed using ultraviolet light, KrF laser light, or ArF laser light. A channel length L of the transistor formed later is determined by the distance between a lower edge portion of the source electrode layer and a lower edge portion of the drain electrode layer which are next to each other over the oxide semiconductor layer 441. In the case where light exposure is performed for a channel length L of less than 25 nm, the light exposure at the time of the formation of the resist mask in the third photolithography step may be performed using extreme ultraviolet light having an extremely short wavelength of several nanometers to several tens of nanometers. In the light exposure by extreme ultraviolet light, the resolution is high and the focus depth is large. Consequently, the channel length L of the transistor to be formed later can be 10 nm to 1000 nm inclusive, whereby operation speed of a circuit can be increased.

In order to reduce the number of photomasks used in a photolithography step and reduce the number of photolithography steps, an etching step may be performed with the use of a multi-tone mask which is a light-exposure mask through which light is transmitted to have a plurality of intensities. A resist mask formed with the use of a multi-tone mask has a plurality of thicknesses and further can be changed in shape by etching; therefore, the resist mask can be used in a plurality of etching steps for processing into different patterns. Therefore, a resist mask corresponding to at least two kinds or more of different patterns can be formed by one multi-tone mask. Thus, the number of light-exposure masks can be reduced and the number of corresponding photolithography steps can be also reduced, whereby simplification of a process can be realized.

Note that it is preferable that etching conditions be optimized so as not to etch and divide the oxide semiconductor layer 441 when the conductive film is etched. However, it is difficult to obtain etching conditions in which only the conductive film is etched away and the oxide semiconductor layer 441 is not etched at all; in some cases, only part of the oxide semiconductor layer 441 is etched away by the etching of the conductive film so as to be a depressed portion (a groove portion).

In this embodiment, since a Ti film is used as the conductive film and the In—Ga—Zn—O-based oxide semiconductor is used for the oxide semiconductor layer 441, an ammonium hydrogen peroxide mixture (a mixed solution of ammonia water, water, and hydrogen peroxide solution) is used as an etchant.

Next, by plasma treatment using a gas such as $N_2O$, $N_2$, or Ar, water or the like adsorbed to a surface of an exposed portion of the oxide semiconductor layer 441 may be removed. In the case where the plasma treatment is performed, the oxide insulating layer 407 which is in contact with part of the oxide semiconductor layer 441 is formed without being exposed to the air.

The oxide insulating layer 407 has a thickness of at least 1 nm or larger and can be formed by a method by which impurities such as water and hydrogen are not included in the oxide insulating layer 407, such as a sputtering method, as appropriate. When hydrogen is contained in the oxide insulating layer 407, entry of the hydrogen to the oxide semiconductor layer or extraction of oxygen in the oxide semiconductor layer by the hydrogen is caused, thereby making the resistance of the backchannel of the oxide semiconductor layer low (to have an n-type conductivity), so that a parasitic channel might be formed. Therefore, it is important that a formation method in which hydrogen is not used is employed such that the oxide insulating layer 407 contains hydrogen as less as possible.

For the oxide insulating layer 407, typically, an inorganic insulating film such as a silicon oxide film or a silicon oxynitride film can be used.

In this embodiment, as the oxide insulating layer 407, a silicon oxide film having a thickness of 200 nm is formed by a sputtering method. The substrate temperature in film formation may be room temperature or higher and 300° C. or lower and in this embodiment, is 100° C. The silicon oxide film can be formed by a sputtering method under a rare gas (typically, argon) atmosphere, an oxygen atmosphere, or a mixed atmosphere containing a rare gas and oxygen. As a target, a silicon oxide target or a silicon target may be used. For example, the silicon oxide film can be formed using a silicon target by a sputtering method in an atmosphere containing oxygen.

In order to remove remaining moisture in the film formation chamber of the oxide insulating layer 407 at the same time as film formation of the oxide semiconductor layer, an entrapment vacuum pump (such as a cryopump) is preferably used. When a cryopump is used to evacuate the film formation chamber, the concentration of impurities contained in the oxide insulating layer 407 can be reduced. In addition, as an evacuation unit for removing moisture remaining in the film formation chamber of the oxide insulating layer 407, a turbo molecular pump provided with a cold trap may be used.

A high-purity gas from which impurities such as hydrogen, water, a hydroxyl group, or hydride are removed is preferably used as a sputtering gas used in formation of the oxide insulating layer 407.

Next, oxygen 421 is introduced to the oxide semiconductor layer 441 through the oxide insulating layer 407 (see FIG. 1C).

As a method for introducing the oxygen 421, an ion implantation method, an ion doping method, or the like can be used. In an ion implantation method, a source gas is made into plasma, ion species included in this plasma are extracted and mass-separated, and ion species with predetermined mass are accelerated and implanted into an object to be processed as an ion beam. In an ion doping method, a source gas is made into plasma, ion species are extracted from this plasma by an operation of a predetermined electric field, and the extracted ion species are accelerated without mass separation and implanted into an object to be processed as an ion beam. When the introduction of oxygen is performed using an ion implantation method involving mass-separation, an impurity such as a metal element can be prevented from being added into the oxide semiconductor layer. In addition, an ion doping method enables ion-beam irradiation to a larger area than an ion implantation method; therefore, when the addition of oxygen is performed using an ion doping method, the takt time can be shortened.

Oxygen is introduced to the oxide semiconductor layer 441 through the oxide insulating layer 407 stacked over the oxide semiconductor layer 441, so that an introduction depth (an introduction region) at which oxygen is introduced can be controlled and thus oxygen can be efficiently introduced to the oxide semiconductor layer 441. The depth at which oxygen is introduced may be controlled by appropriately setting an introduction condition such as acceleration voltage and a dose or a thickness of an oxide insulating layer which the oxygen passes through. In the case where an oxygen gas is used and oxygen is introduced by an ion implantation method, the dose may be set in the range of $1\times10^{13}$ ions/cm$^2$ to $5\times10^{15}$ ions/cm$^2$ both inclusive.

In particular, it is important to remove impurities such as hydrogen, water, a hydroxyl group, or hydride in a channel formation region of an oxide semiconductor layer, so that in the transistor 410 having a bottom-gate structure, a large amount of oxygen is preferably introduced to the vicinity of the interface with the gate insulating layer 402 in the oxide semiconductor layer 441.

It is preferable that a peak of the introduced oxygen concentration in the oxide semiconductor layer be $1\times10^{18}$/cm$^3$ to $3\times10^{20}$/cm$^3$ (more preferably, $1\times10^{18}$/cm$^3$ to $1\times10^{20}$/cm$^3$).

The above described oxygen concentration can be measured in the following manner: an oxygen isotope of mass number 18 is introduced as an oxygen, and after the introduction, the concentration of the oxygen isotope of mass number 18 in the oxide semiconductor layer is analyzed by a secondary ion mass spectroscopy (SIMS).

Next, the oxide semiconductor layer 441 to which oxygen is introduced and part of which (the channel formation region) is in contact with the oxide insulating layer 407 is subjected to heat treatment.

The temperature of the heat treatment is 250° C. to 700° C. inclusive, preferably 400° C. to 700° C. inclusive, or lower than the strain point of the substrate. For example, after the substrate is put in an electric furnace which is a kind of heat treatment apparatus, the oxide semiconductor layer 441 is subjected to the heat treatment at 450° C. for one hour in a nitrogen atmosphere.

Note that a heat treatment apparatus used is not limited to an electric furnace, and a device for heating an object to be processed by heat conduction or heat radiation from a heating element such as a resistance heating element may be alternatively used. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high-temperature gas, an inert gas which does not react with an object to be processed by heat treatment, such as nitrogen or a rare gas like argon, is used.

For example, as the heat treatment, GRTA may be performed as follows. The substrate is put in an inert gas heated at high temperature of 650° C. to 700° C., is heated for several minutes, and is taken out of the inert gas.

The heat treatment may be performed under an atmosphere of nitrogen, oxygen, ultra-dry air (air in which a water content is 20 ppm or lower, preferably 1 ppm or lower, more preferably 10 ppb or lower), or a rare gas (argon, helium, or the like). Note that it is preferable that water, hydrogen, or the like be not contained in the atmosphere of nitrogen, oxygen, ultra-dry air, or a rare gas. It is also preferable that the purity of nitrogen, oxygen, or the rare gas which is introduced into a heat treatment apparatus be set to be 6N (99.9999%) or higher, preferably 7N (99.99999%) or higher (that is, the impurity concentration is 1 ppm or lower, preferably 0.1 ppm or lower).

By the introduction of oxygen, a bond between a metal included in the oxide semiconductor and hydrogen or a bond between the metal and a hydroxyl group is cut. At the same time, the hydrogen or the hydroxyl group reacts with oxygen to produce water. Consequently, hydrogen or a hydroxyl group which is impurity can be easily eliminated as water by the heat treatment performed later.

By the introduction of oxygen and the heat treatment, the oxide semiconductor layer can be dehydrated or dehydrogenated, whereby impurities such as hydrogen, moisture, a hydroxyl group, or hydride can be removed from the oxide semiconductor layer.

The oxide semiconductor layer 441 and the oxide insulating layer 407 containing oxygen are in contact with each other when being subjected to the heat treatment; thus, oxygen which is one of the main component of the oxide semiconductor layer 441 and is reduced in the step of removing impurities, can be supplied from the oxide insulating layer 407 containing oxygen to the oxide semiconductor layer 441. Through the above process, the oxide semiconductor layer 441 is highly purified, so that the electrically i-type (intrinsic) oxide semiconductor layer 403 is obtained.

The number of carriers in the highly-purified oxide semiconductor layer 403 is very small (close to zero), and the carrier concentration is less than $1\times10^{14}/cm^3$, preferably less than $1\times10^{12}/cm^3$, still preferably less than $1\times10^{11}/cm^3$.

Through the above process, the transistor 410 is formed (see FIG. 1D). The transistor 410 is a transistor including the oxide semiconductor layer 403 which is highly purified and from which impurities such as hydrogen, moisture, a hydroxyl group, or hydride (also referred to as a hydrogen compound) are intentionally removed. Therefore, variation in the electric characteristics of the transistor 410 is suppressed and the transistor 410 is electrically stable.

The protective insulating layer 409 which prevents impurities such as moisture or hydrogen from entering from the outside is preferably formed over the oxide insulating layer 407 so that these impurities are not included in the oxide semiconductor layer 403 again (see FIG. 1E). An inorganic insulating film is used for the protective insulating layer 409, and a silicon nitride film, an aluminum oxide film, or the like may be used. For example, a silicon nitride film is formed by an RF sputtering method. Since an RF sputtering method has high productivity, it is preferably used as a film formation method of the protective insulating layer 409.

Heat treatment may be performed after the protective insulating layer 409 is formed. For example, the heat treatment may be performed at 100° C. to 200° C. inclusive for one hour to 30 hours inclusive in the air. This heat treatment may be performed at fixed heating temperature. Alternatively, the following change in the heating temperature may be conducted plural times repeatedly: the heating temperature is increased from room temperature to temperature of 100° C. to 200° C. inclusive and then decreased to room temperature.

In the transistor 410 using the highly-purified oxide semiconductor layer 403 manufactured in this embodiment, the current in an off state (an off-state current value) per micrometer in channel width can be reduced to less than 10 zA/μm at room temperature and less than 100 zA/μm at 85° C.

Further, the field-effect mobility of the transistor 410 including the oxide semiconductor layer 403 can be relatively high, whereby high-speed operation is possible. For example, when such a transistor which can operate at high speed is used for a liquid crystal display device, a switching transistor in a pixel portion and a driver transistor in a driver circuit portion can be formed over one substrate. That is, since a semiconductor device formed of a silicon wafer or the like is not additionally needed as a driver circuit, the number of components of the semiconductor device can be reduced. In addition, by using a transistor which can operate at high speed in a pixel portion, a high-quality image can be provided.

As described above, a semiconductor device including an oxide semiconductor, which has stable electric characteristics, can be provided. Therefore, a semiconductor device with high reliability can be provided.

Embodiment 2

In this embodiment, another embodiment of a semiconductor device and a method for manufacturing the semiconductor device will be described with reference to FIGS. 2A to 2D. The same portion as or a portion having a function similar to those in the above embodiment can be formed in a manner similar to that described in the above embodiment, and also the steps similar to those in the above embodiment can be performed in a manner similar to that described in the above embodiment, and repetitive description is omitted. In addition, detailed description of the same portions is omitted.

A transistor 450 shown in FIGS. 2A to 2D is a staggered thin film transistor which is one of a top-gate transistor.

The transistor 450 includes the source electrode layer 405a, the drain electrode layer 405b, the oxide semiconductor layer 403, an oxide insulating layer 437, a protective insulating layer 438, and the gate electrode layer 401, which are formed over the substrate 400 having an insulating surface. The oxide insulating layer 437 and the protective insulating layer 438 serve as a gate insulating layer.

FIGS. 2A to 2D show an example of a method for manufacturing the transistor 450.

First, an insulating layer 436 is formed over the substrate 400 having an insulating surface.

The source electrode layer 405a and the drain electrode layer 405b are formed over the insulating layer 436. An oxide semiconductor layer 451 is formed over the insulating layer 436, the source electrode layer 405a, and the drain electrode layer 405b, in the manner similar to that of the oxide semiconductor layer 441. In this embodiment, an oxide semiconductor film is formed using an In—Ga—Zn—O-based metal oxide target by a sputtering method, and an In—Ga—Zn—O-based oxide semiconductor film is processed into an island-shaped oxide semiconductor layer 451 (see FIG. 2A).

The oxide insulating layer 437 functioning as a gate insulating layer is formed over the oxide semiconductor layer 451. The oxide insulating layer 437 is formed in the manner similar to that of the oxide insulating layer 407. In this embodiment, a silicon oxide film is formed to have a thickness of 200 nm as the oxide insulating layer 437 by a sputtering method.

Figure 2A:
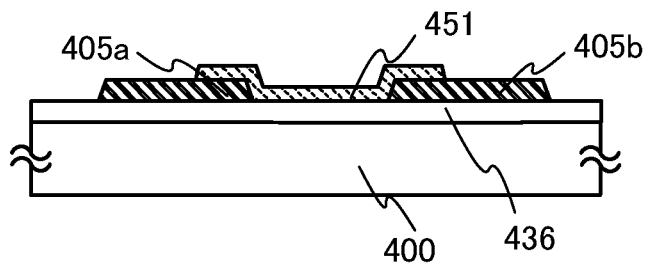
FIGS. 2A to 2D show one embodiment of a semiconductor device and a method for manufacturing the semiconductor device.
Figure 2B:
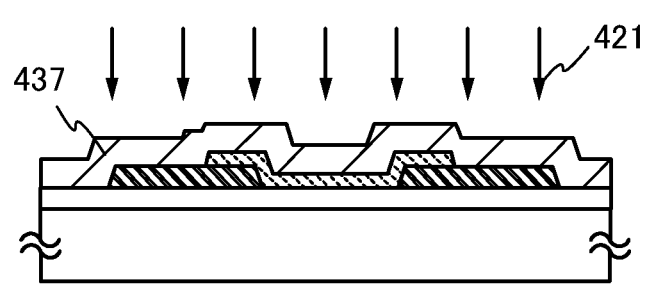
Figure 2C:
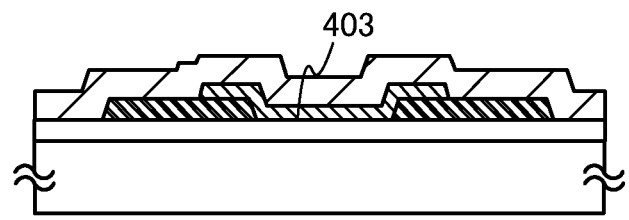

Next, the oxygen 421 is introduced to the oxide semiconductor layer 451 through the oxide insulating layer 437 (see FIG. 2B). As a method for introducing the oxygen 421, an ion implantation method, an ion doping method, or the like can be used. In this embodiment, an ion implantation method is performed using an oxygen gas to introduce oxygen.

Oxygen is introduced to the oxide semiconductor layer 451 through the oxide insulating layer 437 stacked over the oxide semiconductor layer 451, so that an introduction depth (an introduction region) at which oxygen is introduced can be controlled and thus oxygen can be efficiently introduced to the oxide semiconductor layer 451. The depth at which oxygen is introduced may be controlled by appropriately setting an introduction condition such as acceleration voltage and a dose or a thickness of the oxide insulating layer 437 which the oxygen passes through. For example, in the case where an oxygen gas is used and oxygen is introduced by an ion implantation method, the dose may be set in the range of $1\times10^{13}$ ions/cm$^2$ to $5\times10^{15}$ ions/cm$^2$ both inclusive.

In particular, it is important to remove impurities such as hydrogen, water, a hydroxyl group, or hydride in a channel formation region of an oxide semiconductor layer, so that in the transistor 450 having a top-gate structure, a large amount of oxygen is preferably introduced to the vicinity of the interface with the oxide insulating layer 437 in the oxide semiconductor layer 451.

It is preferable that a peak of the introduced oxygen concentration in the oxide semiconductor layer be $1\times10^{18}$/cm$^3$ to $3\times10^{20}$/cm$^3$ (more preferably, $1\times10^{18}$/cm$^3$ to $1\times10^{20}$/cm$^3$).

The above described oxygen concentration can be measured in the following manner: an oxygen isotope of mass number 18 is introduced as an oxygen, and after the introduction, the concentration of the oxygen isotope of mass number 18 in the oxide semiconductor layer is analyzed by a secondary ion mass spectroscopy (SIMS).

Next, the oxide semiconductor layer 451 to which oxygen is introduced and which is in contact with the oxide insulating layer 437 is subjected to heat treatment.

The temperature of the heat treatment is 250° C. to 700° C. inclusive, 400° C. to 700° C. inclusive, or lower than the strain point of a substrate. The heat treatment may be performed under an atmosphere of nitrogen, oxygen, ultra-dry air (air in which a water content is 20 ppm or lower, preferably 1 ppm or lower, more preferably 10 ppb or lower), or a rare gas (argon, helium, or the like). Note that it is preferable that water, hydrogen, or the like be not contained in the atmosphere of nitrogen, oxygen, ultra-dry air, or a rare gas. For example, after the substrate is put in an electric furnace which is a kind of heat treatment apparatus, the oxide semiconductor layer 451 is subjected to the heat treatment at 450° C. for one hour in a nitrogen atmosphere.

By the introduction of oxygen, a bond between a metal included in the oxide semiconductor and hydrogen or a bond between the metal and a hydroxyl group is cut. At the same time, the hydrogen or the hydroxyl group reacts with oxygen to produce water. Consequently, hydrogen or a hydroxyl group which is an impurity can be easily eliminated as water in the heat treatment performed later.

By the introduction of oxygen and the heat treatment, the oxide semiconductor layer 451 can be dehydrated or dehydrogenated, whereby impurities such as hydrogen, moisture, a hydroxyl group, or hydride can be removed from the oxide semiconductor layer.

The oxide semiconductor layer 451 and the oxide insulating layer 437 containing oxygen are in contact with each other when being subjected to the heat treatment; thus, oxygen which is one of the main component of the oxide semiconductor and is reduced in the step of removing impurities, can be supplied from the oxide insulating layer 437 containing oxygen to the oxide semiconductor layer 451. Through the above process, the oxide semiconductor layer 451 is highly purified, so that the electrically i-type (intrinsic) oxide semiconductor layer 403 is obtained (see FIG. 2C).

The protective insulating layer 438 which prevents impurities such as moisture or hydrogen from entering from the outside is preferably formed over the oxide insulating layer 437 so that these impurities are not included in the oxide semiconductor layer 403 again. The protective insulating layer 438 also functions as a gate insulating layer like the oxide insulating layer 437. For example, a silicon nitride film is formed as the protective insulating layer 438 by an RF sputtering method.

The gate electrode layer 401 is formed over the protective insulating layer 438 overlapping with the oxide semiconductor layer 403.

Figure 2D:
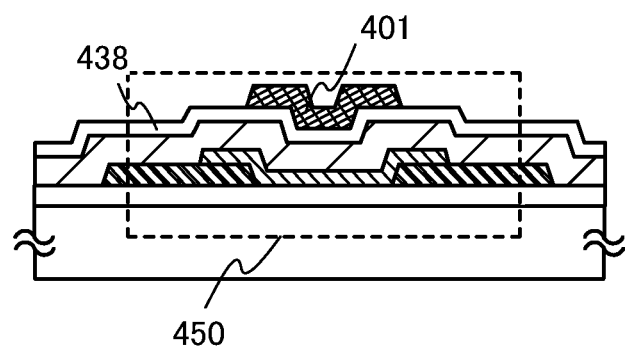

Through the above process, the transistor 450 is formed (see FIG. 2D). The transistor 450 is a transistor including the oxide semiconductor layer 403 which is highly purified and from which impurities such as hydrogen, moisture, a hydroxyl group, or hydride (also referred to as a hydrogen compound) are intentionally removed. Therefore, variation in the electric characteristics of the transistor 450 is suppressed and the transistor 450 is electrically stable.

As described above, a semiconductor device including an oxide semiconductor, which has stable electric characteristics, can be provided. Therefore, a semiconductor device with high reliability can be provided.

This embodiment can be implemented combining with another embodiment as appropriate.

Embodiment 3

In this embodiment, another embodiment of a semiconductor device and a method for manufacturing the semiconductor device will be described with reference to FIGS. 3A to 3E. The same portion as or a portion having a function similar to those in the above embodiment can be formed in a manner similar to that described in the above embodiment, and also the steps similar to those in the above embodiment can be performed in a manner similar to that described in the above embodiment, and repetitive description is omitted. In addition, detailed description of the same portions is omitted.

A transistor 420 shown in FIGS. 3A to 3E is one of bottom-gate transistors called channel-protective transistors (also referred to as channel-stop transistors) and is also called an inverted staggered thin film transistor.

The transistor 420 includes the gate electrode layer 401, the gate insulating layer 402, the oxide semiconductor layer 403, an oxide insulating layer 427 functioning as a channel protective layer for covering a channel formation region of the oxide semiconductor layer 403, the source electrode layer 405a, and the drain electrode layer 405b, which are formed over the substrate 400 having an insulating surface. Further, a protective insulating layer 409 is formed so as to cover the transistor 420.

FIGS. 3A to 3E show an example of a method for manufacturing a transistor 420.

First, the gate electrode layer 401 is formed over the substrate 400 having an insulating surface. The gate insulating layer 402 is formed over the gate electrode layer 401.

Next, an oxide semiconductor layer 422 is formed over the gate insulating layer 402 in the manner similar to that of the oxide semiconductor layer 441. In this embodiment, an In—Ga—Zn—O-based oxide film is formed using an In—Ga—Zn—O-based metal oxide target by a sputtering method, and the In—Ga—Zn—O-based oxide film is processed into the island-shaped oxide semiconductor layer 422.

Figure 3A:
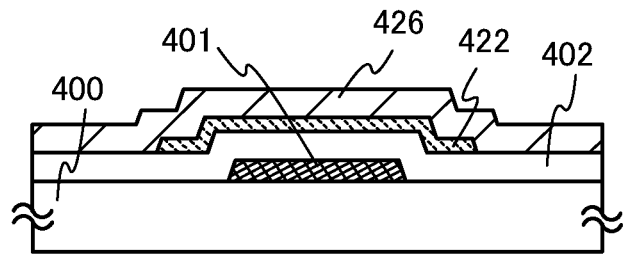
FIGS. 3A to 3E show one embodiment of a semiconductor device and a method for manufacturing the semiconductor device.

An oxide insulating layer 426 is formed over the oxide semiconductor layer 422 like the oxide insulating layer 407 (see FIG. 3A). In this embodiment, a silicon oxide film is formed to have a thickness of 200 nm as the oxide insulating layer 426 by a sputtering method.

Figure 3B:
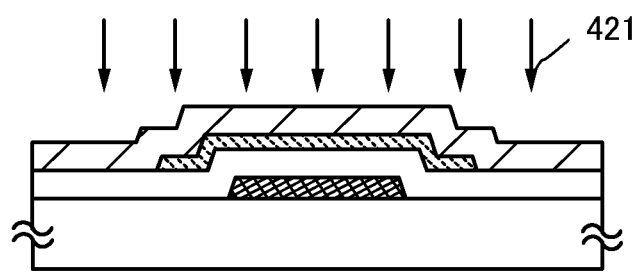
Figure 3C:
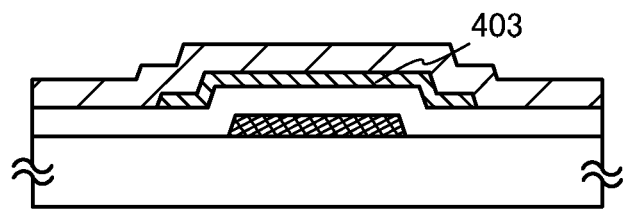

Next, the oxygen 421 is introduced to the oxide semiconductor layer 422 through the oxide insulating layer 426 (see FIG. 3B). As a method for introducing the oxygen 421, an ion implantation method, an ion doping method, or the like can be used. In this embodiment, an ion implantation method is performed using an oxygen gas to introduce oxygen.

Oxygen is introduced to the oxide semiconductor layer 422 through the oxide insulating layer 426 stacked over the oxide semiconductor layer 422, so that an introduction depth (an introduction region) at which oxygen is introduced can be controlled and thus oxygen can be efficiently introduced to the oxide semiconductor layer 422. The depth at which oxygen is introduced may be controlled by appropriately setting an introduction condition such as acceleration voltage and a dose or a thickness of the oxide insulating layer 426 which the oxygen passes through. For example, in the case where an oxygen gas is used and oxygen is introduced by an ion implantation method, the dose may be set in the range of $1\times10^{13}$ ions/cm$^2$ to $5\times10^{15}$ ions/cm$^2$ both inclusive.

In particular, it is important to remove impurities such as hydrogen, water, a hydroxyl group, or hydride in a channel formation region of the oxide semiconductor layer 422, so that in the transistor 420 having a bottom-gate structure, a large amount of oxygen is preferably introduced to the vicinity of the interface with the gate insulating layer 402 in the oxide semiconductor layer 422.

It is preferable that a peak of the introduced oxygen concentration in the oxide semiconductor layer 422 be $1\times10^{18}$/cm$^3$ to $3\times10^{20}$/cm$^3$ (more preferably, $1\times10^{18}$/cm$^3$ to $1\times10^{20}$/cm$^3$).

The above described oxygen concentration can be measured in the following manner: an oxygen isotope of mass number 18 is introduced as an oxygen, and after the introduction, the concentration of the oxygen isotope of mass number 18 in the oxide semiconductor layer is analyzed by a secondary ion mass spectroscopy (SIMS).

Next, the oxide semiconductor layer 422 to which oxygen is introduced and which is in contact with the oxide insulating layer 426 is subjected to heat treatment.

The temperature of the heat treatment is 250° C. to 700° C. inclusive, 400° C. to 700° C. inclusive, or lower than the strain point of a substrate. The heat treatment may be performed under an atmosphere of nitrogen, oxygen, ultra-dry air (air in which a water content is 20 ppm or lower, preferably 1 ppm or lower, more preferably 10 ppb or lower), or a rare gas (argon, helium, or the like). Note that it is preferable that water, hydrogen, or the like be not contained in the atmosphere of nitrogen, oxygen, ultra-dry air, or a rare gas. For example, after the substrate is put in an electric furnace which is a kind of heat treatment apparatus, the oxide semiconductor layer 422 is subjected to the heat treatment at 450° C. for one hour in a nitrogen atmosphere.

By the introduction of oxygen, a bond between a metal included in the oxide semiconductor and hydrogen or a bond between the metal and a hydroxyl group is cut. At the same time, the hydrogen or the hydroxyl group reacts with oxygen to produce water. Consequently, hydrogen or a hydroxyl group which is an impurity can be easily eliminated as water in the heat treatment performed later.

By the introduction of oxygen and the heat treatment, the oxide semiconductor layer 422 can be dehydrated or dehydrogenated, whereby impurities such as hydrogen, moisture, a hydroxyl group, and hydride can be removed from the oxide semiconductor layer 422.

The oxide semiconductor layer 422 and the oxide insulating layer 426 containing oxygen are in contact with each other when being subjected to the heat treatment; thus, oxygen which is one of the main component of the oxide semiconductor and is reduced in the step of removing impurities, can be supplied from the oxide insulating layer 426 containing oxygen to the oxide semiconductor layer 422. Through the above process, the oxide semiconductor layer 422 is highly purified, so that the electrically i-type (intrinsic) oxide semiconductor layer 403 is obtained.

Figure 3D:
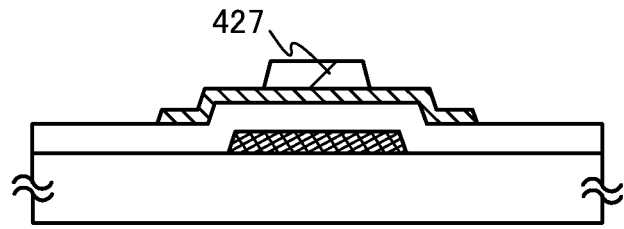

The oxide insulating layer 426 is processed into the oxide insulating layer 427 which functions as a channel protective layer covering the channel formation region of the oxide semiconductor layer 403 by a photolithography step (see FIG. 3D). Note that during this step for etching the oxide insulating layer 426, part of the oxide semiconductor layer 403 is removed in some cases. In this case, the thickness of a region of the oxide semiconductor layer 403 which is not covered with the oxide insulating layer 427 becomes small.

The source electrode layer 405a and the drain electrode layer 405b are formed over the oxide semiconductor layer 403 and the oxide insulating layer 427.

Figure 3E:
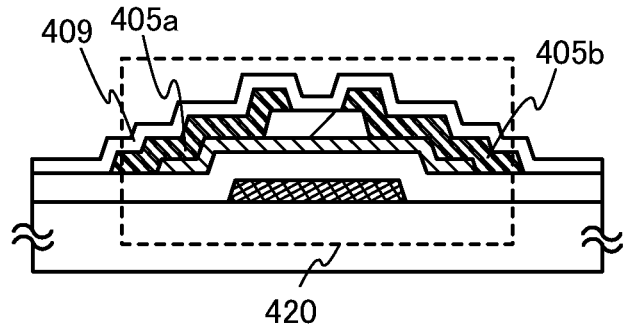

Through the above process, the transistor 420 is formed (see FIG. 3E). The transistor 420 is a transistor including the oxide semiconductor layer 403 which is highly purified and from which impurities such as hydrogen, moisture, a hydroxyl group, or hydride (also referred to as a hydrogen compound) are intentionally removed. Therefore, variation in the electric characteristics of the transistor 420 is suppressed and the transistor 420 is electrically stable.

The protective insulating layer 409 which prevents impurities such as moisture or hydrogen from entering from the outside is preferably formed over the oxide insulating layer 427, the source electrode layer 405a, and the drain electrode layer 405b so that these impurities are not included in the oxide semiconductor layer 403 again (see FIG. 3E). For example, a silicon nitride film is formed as the protective insulating layer 409 by an RF sputtering method.

As described above, a semiconductor device including an oxide semiconductor, which has stable electric characteristics, can be provided. Therefore, a semiconductor device having high reliability can be provided.

This embodiment can be implemented combining with another embodiment as appropriate.

Embodiment 4

In this embodiment, another embodiment of a semiconductor device and a method for manufacturing the semiconductor device will be described with reference to FIGS. 4A and 4B. In this embodiment, a transistor will be shown as an example of the semiconductor device. The same portion as or a portion having a function similar to those in the above embodiment can be formed in a manner similar to that described in the above embodiment, and also the steps similar to those in the above embodiment can be performed in a manner similar to that described in the above embodiment, and repetitive description is omitted. In addition, detailed description of the same portions is omitted.

There is no particular limitation on the structure of the transistor; for example, a staggered type transistor or a planar type transistor having a top-gate structure or a bottom-gate structure can be employed. Further, the transistor may have a single gate structure including one channel formation region, a double gate structure including two channel formation regions, or a triple gate structure including three channel formation regions. Furthermore, the transistor may have a dual gate structure including two gate electrode layers positioned over and below a channel region with a gate insulating layer provided therebetween.

Figure 4A:
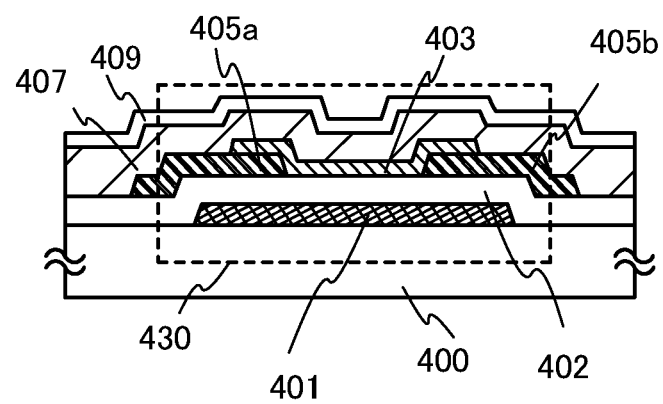
FIGS. 4A and 4B each show one embodiment of a semiconductor device.
Figure 4B:
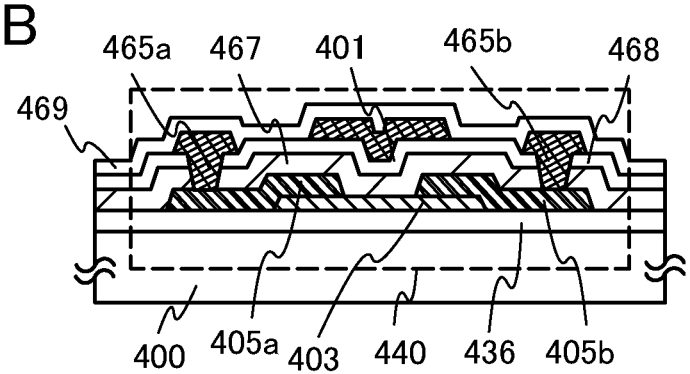

Note that examples of a cross-sectional structure of the transistor shown in FIGS. 4A and 4B are described below. Transistors 430 and 440 shown in FIGS. 4A and 4B are transistors like the transistors 410, 420, and 450 shown in Embodiments 1 to 3; the transistors 430 and 440 include the oxide semiconductor layer which is highly purified and from which impurities such as hydrogen, moisture, a hydroxyl group, or hydride (also referred to as a hydrogen compound) are intentionally removed. Therefore, variation in the electric characteristics of the transistors 430 and 440 is suppressed and the transistor 430 and 440 are electrically stable. Consequently, a semiconductor device with high reliability can be provided.

The transistor 430 shown in FIG. 4A is a bottom-gate transistor. The transistor 430 includes the gate electrode layer 401, the gate insulating layer 402, the source electrode layer 405a, the drain electrode layer 405b, and the oxide semiconductor layer 403, which are formed over the substrate 400 having an insulating surface. The oxide insulating layer 407 is provided to cover the transistor 430 and is in contact with the oxide semiconductor layer 403. In addition, the protective insulating layer 409 is formed over the oxide insulating layer 407.

In the transistor 430, the gate insulating layer 402 is provided over and in contact with the substrate 400 and the gate electrode layer 401. The source electrode layer 405a and the drain electrode layer 405b are provided over and in contact with the gate insulating layer 402. The oxide semiconductor layer 403 is provided over the gate insulating layer 402, the source electrode layer 405a, and the drain electrode layer 405b.

The transistor 440 shown in FIG. 4B is a top-gate transistor. The transistor 440 includes the insulating layer 436, the oxide semiconductor layer 403, the source electrode layer 405a, the drain electrode layer 405b, an oxide insulating layer 467 and a protective insulating layer 468 which form a gate insulating layer, and the gate electrode layer 401, which are formed over the substrate 400 having an insulating surface. A wiring layer 465a and a wiring layer 465b are provided to be in contact with and electrically connected to the source electrode layer 405a and the drain electrode layer 405b respectively. A protective insulating layer 469 is formed to cover the gate electrode layer 401, the wiring layer 465a, and the wiring layer 465b.

As an oxide semiconductor used for the oxide semiconductor layer 403, a four-component metal oxide such as an In—Sn—Ga—Zn—O-based oxide semiconductor; a three-component metal oxide such as an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor; a two-component metal oxide such as an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, or an In—Mg—O-based oxide semiconductor; an In—O-based oxide semiconductor; a Sn—O-based oxide semiconductor; or a Zn—O-based oxide semiconductor can be used. Further, $SiO_2$ may be contained in the above oxide semiconductor. Here, for example, an In—Ga—Zn—O-based oxide semiconductor is an oxide containing at least In, Ga, and Zn, and there is no particular limitation on the composition ratio thereof. Furthermore, In—Ga—Zn—O-based oxide semiconductor may contain an element other than In, Ga, and Zn.

For the oxide semiconductor layer 403, a thin film represented by $InMO_3(ZnO)_m$ (m>0, and m is not a natural number) can be used. Here, M represents one or more metal elements selected from Ga, Al, Mn, and Co. For example, M can be Ga, Ga and Al, Ga and Mn, Ga and Co, or the like.

In the bottom-gate transistor 430, an insulating film serving as a base film may be provided between the substrate and the gate electrode layer. The base film has a function of preventing diffusion of an impurity element from the substrate, and can be formed to have a single-layer structure or a stacked-layer structure using one or more of a silicon nitride film, a silicon oxide film, a silicon nitride oxide film, and a silicon oxynitride film.

The substrate 400, the gate electrode layer 401, the gate insulating layer 402, the source electrode layer 405a, and the drain electrode layer 405b can be formed using a material and a method similar to those in the Embodiment 1.

A material similar to that of the source electrode layer 405a and the drain electrode layer 405b can be used for conductive films such as the wiring layer 465a and the wiring layer 465b which are connected to the source electrode layer 405a and the drain electrode layer 405b respectively.

The insulating layer 436 and the oxide insulating layer 467 functioning as a gate insulating layer can be formed using a material similar to that of the oxide insulating layer 407. Typically, an inorganic insulating film such as a silicon oxide film or a silicon oxynitride film can be used.

For the protective insulating layer 468 functioning as a gate insulating layer and the protective insulating layer 469, an inorganic insulating film such as a silicon nitride film, an aluminum nitride film, a silicon nitride oxide film, an aluminum nitride oxide film, or an aluminum oxide film can be used.

Further, a planarization insulating film may be formed over the protective insulating layer 409 so that surface roughness due to the transistor is reduced. For the planarization insulating film, an organic material such as polyimide, acrylic, or benzocyclobutene can be used. Other than such organic materials, it is also possible to use a low-dielectric constant material (a low-k material) or the like. Note that the planarization insulating film may be formed by stacking a plurality of insulating films formed from these materials.

In the transistors 430 and 440, the oxide semiconductor layer 403 is an oxide semiconductor layer which is highly purified and from which impurities such as hydrogen, moisture, a hydroxyl group, or hydride (also referred to as a hydrogen compound) are intentionally removed by introducing oxygen through the oxide insulating layers 407 and 467 stacked over the oxide semiconductor layer 403 and performing heat treatment. By introducing oxygen, a bond between a metal included in the oxide semiconductor and hydrogen or a bond between the metal and a hydroxyl group is cut, and the hydrogen or the hydroxyl group is reacted with oxygen to produce water; this leads to easy elimination of hydrogen or a hydroxyl group that is an impurity, as water by the heat treatment performed later.

Oxygen is introduced to the oxide semiconductor layer through an oxide insulating layer stacked over the oxide semiconductor layer, so that an introduction depth (an introduction region) at which oxygen is introduced can be controlled and thus oxygen can be efficiently introduced to the oxide semiconductor layer.

Each of the oxide insulating layers 407 and 467 containing oxygen is in contact with the oxide semiconductor layer when being subjected to the heat treatment; thus, oxygen which is one of the main component of the oxide semiconductor and is reduced in the step of removing impurities, can be supplied from each of the oxide insulating layers 407 and 467 containing oxygen to the oxide semiconductor layer. Thus, the oxide semiconductor layer 403 is more highly purified to become electrically i-type (intrinsic).

In each of the transistors 430 and 440 including the highly-purified oxide semiconductor layer 403, the current in an off state (the off-state current) can be small.

The field-effect mobility of the transistors 430 and 440 each including the highly-purified oxide semiconductor layer 403 can be relatively high, whereby high-speed operation is possible. For example, when such a transistor which can operate at high speed is used for a liquid crystal display device, a switching transistor in a pixel portion and a driver transistor in a driver circuit portion can be formed over one substrate. That is, since a semiconductor device formed of a silicon wafer or the like is not additionally needed as a driver circuit, the number of components of the semiconductor device can be reduced. In addition, by using a transistor which can operate at high speed in a pixel portion, a high-quality image can be provided.

As described above, a semiconductor device including an oxide semiconductor, which has stable electric characteristics, can be provided. Consequently, a semiconductor device with high reliability can be provided.

Embodiment 5

In this embodiment, another embodiment of the semiconductor device is described with reference to FIGS. 1A to 1E and FIGS. 5A to 5D. The same portion as or a portion having a function similar to those in the above embodiment can be formed in a manner similar to that described in the above embodiment, and also the steps similar to those in the above embodiment can be performed in a manner similar to that described in the above embodiment, and repetitive description is omitted. In addition, detailed description of the same portions is omitted.

In this embodiment, an example of a structure in which a source electrode layer and/or a drain electrode layer of a transistor are/is connected to a conductive layer (such as a wiring layer or a pixel electrode layer) is shown. Note that in this embodiment, the transistor 410 shown in Embodiment 1 is used as a transistor in a description but any other transistors shown in Embodiments 2 to 4 can be used.

Figure 5A:
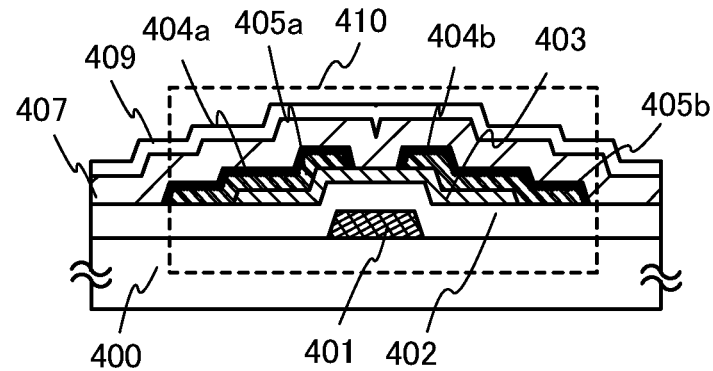
FIGS. 5A to 5D show one embodiment of a semiconductor device and a method for manufacturing the semiconductor device.

As shown in FIG. 5A, the transistor 410 includes the gate electrode layer 401, the gate insulating layer 402, the oxide semiconductor layer 403, the source electrode layer 405a, and the drain electrode layer 405b, which are formed over the substrate 400 having an insulating surface. The oxide insulating layer 407 and the protective insulating layer 409 are stacked over the transistor 410 in this order.

As shown in Embodiment 1, in the manufacturing process of the transistor 410, the oxide insulating layer 407 is formed over the oxide semiconductor layer 403, the source electrode layer 405a, and the drain electrode layer 405b, and the oxygen 421 is introduced to the oxide semiconductor layer 441 through the oxide insulating layer 407, and heat treatment is performed (see FIG. 1B to 1D). During this oxygen introduction and heat treatment step, the oxygen 421 reaches and is irradiated (is introduced to the vicinity of a surface) to the source electrode layer 405a and the drain electrode layer 405b in addition to the oxide semiconductor layer 403. Thus, as shown in FIG. 5A, the surfaces of the source electrode layer 405a and the drain electrode layer 405b irradiated with the oxygen 421 are oxidized, and metal oxide regions 404a and 404b are formed between the source electrode layer 405a and the oxide insulating layer 407 and between the drain electrode layer 405b and the oxide insulating layer 407 respectively in some cases. The metal oxide regions 404a and 404b may be in the form of a film in some cases.

Figure 5B:
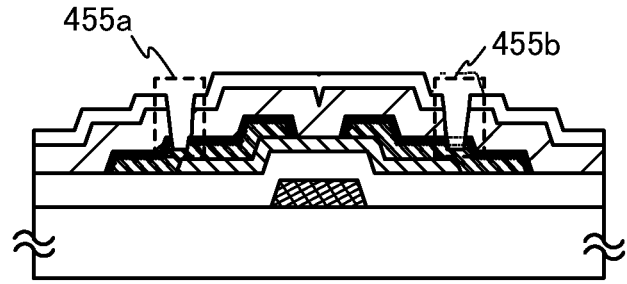

In the case of FIG. 5A, openings 455a and 455b for forming the conductive layer connected to the source electrode layer 405a and the drain electrode layer 405b are preferably formed in the following manner: the metal oxide regions 404a and 404b having high resistance are removed; and the openings 455a and 455b are formed until the source electrode layer 405a and the drain electrode layer 405b having low resistance are exposed (see FIG. 5B). Parts of the protective insulating layer 409, the oxide insulating layer 407, and the meal oxide regions 404a and 404b are removed to form the openings 455a and 455b.

Figure 5C:
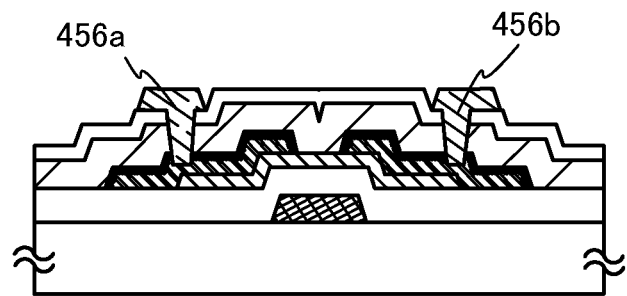

Next, conductive layers 456a and 456b are formed to be in contact with the source electrode layer 405a and the drain electrode layer 405b exposed in the openings 455a and 455b (see FIG. 5C). The conductive layers 456a and 456b are formed to be directly in contact with the source electrode layer 405a and the drain electrode layer 405b having low resistance, not through the metal oxide regions 404a and 404b having high resistance, so that a favorable electrical connection (electrical contact) can be obtained.

Figure 5D:
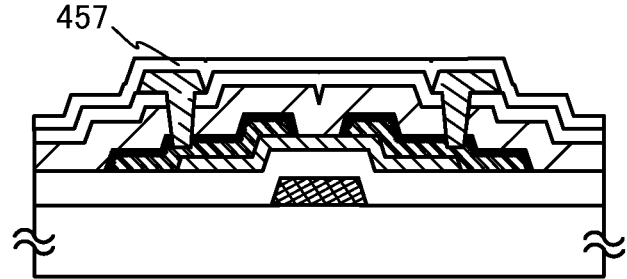

A protective insulating layer 457 may be formed over the conductive layers 456a and 456b as a protective layer to cover the transistor 410 (see FIG. 5D). Moreover, by covering the protective insulating layer 457, it is possible to prevent impurities such as hydrogen and moisture from entering the oxide semiconductor layer 403 from the openings 455a and 455b.

In the source electrode layer 405a and the drain electrode layer 405b, a conductive film to which oxygen is not easily introduced (typically, a tungsten film, a tantalum film, or the like) may be formed on the surface irradiated with oxygen. For example, when the source electrode layer 405a and the drain electrode layer 405b are formed of a stacked layer of a titanium film and a tungsten film, and the tungsten film is provided on the side to which oxygen is introduced, formation of a metal oxide region having high resistance can be suppressed.

As described above, a favorable electrical connection of a transistor can be obtained, whereby a semiconductor device including an oxide semiconductor with stable electric characteristics can be provided. Therefore, a semiconductor device with high reliability can be provided.

Embodiment 6

In this embodiment, another embodiment of a semiconductor device and a method for manufacturing the semiconductor device will be described. The same portion as or a portion having a function similar to those in the above embodiment can be formed in a manner similar to that described in the above embodiment, and also the steps similar to those in the above embodiment can be performed in a manner similar to that described in the above embodiment, and repetitive description is omitted. In addition, detailed description of the same portions is omitted.

Note that this embodiment can be applied to any of the transistors 410, 420, 430, 440, and 450 shown in Embodiments 1 to 5.

In this embodiment, an example of performing heat treatment to the oxide semiconductor layer before forming the oxide insulating layers 407, 437, 426, and 467 contacting with the oxide semiconductor layer, in the method for manufacturing the transistors 410, 420, 430, 440, and 450 is shown.

This heat treatment may be performed on the oxide semiconductor layer before the oxide semiconductor layer is processed into the island-shaped oxide semiconductor layer, as long as the heat treatment is performed after the formation of the oxide semiconductor layer and before the formation of the oxide insulating layer. In the case of the transistor 410, the heat treatment may be performed before or after the formation of the source electrode layer 405a and the drain electrode layer 405b.

The temperature of the heat treatment is 400° C. to 750° C. inclusive or 400° C. or higher and lower than the strain point of a substrate. For example, the substrate is put in an electric furnace which is a kind of heat treatment apparatus, the oxide semiconductor layer is subjected to the heat treatment at 450° C. for one hour in a nitrogen atmosphere. After the heat treatment, it is preferable that the oxide insulating layer be formed without exposure to the air, and water and hydrogen be prevented from being included in the oxide semiconductor layer again.

Further, a heat treatment apparatus used is not limited to an electric furnace, and a device for heating a process object by heat conduction or heat radiation from a heating element such as a resistance heating element may be alternatively used. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the high-temperature gas, an inert gas which does not react with an object to be treated by heat treatment, such as nitrogen or a rare gas like argon, is used.

For example, as the heat treatment, GRTA may be performed as follows. The substrate is put in an inert gas heated at high temperature of 650° C. to 700° C., is heated for several minutes, and is taken out of the inert gas.

The heat treatment may be performed under an atmosphere of nitrogen, oxygen, ultra-dry air (air in which a water content is 20 ppm or lower, preferably 1 ppm or lower, more preferably 10 ppb or lower), or a rare gas (argon, helium, or the like). Note that it is preferable that water, hydrogen, or the like be not contained in the atmosphere of nitrogen, oxygen, ultra-dry air, or rare gas. It is also preferable that the purity of nitrogen, oxygen, or the a rare gas which is introduced into a heat treatment apparatus be set to be 6N (99.9999%) or higher, preferably 7N (99.99999%) or higher (that is, the impurity concentration is 1 ppm or lower, preferably 0.1 ppm or lower).

With this heat treatment, impurities such as moisture or hydrogen in the oxide semiconductor layer can be reduced.

Moreover, by forming the oxide insulating layer over the oxide semiconductor layer and introducing oxygen to the semiconductor layer through the oxide insulating layer, a bond between a metal included in the oxide semiconductor layer and hydrogen, or a bond between the metal and a hydroxyl group is cut, and the hydrogen or the hydroxyl group reacts with oxygen to produce water. Then, the heat treatment is further performed after the introduction of oxygen, whereby impurities such as hydrogen or a hydroxyl group left can be easily eliminated as water.

The oxide semiconductor layer and the oxide insulating layer containing oxygen are in contact with each other when being subjected to the heat treatment; thus, oxygen which is one of the major component of the oxide semiconductor and is reduced in the step of removing impurities, can be supplied from the oxide insulating layer containing oxygen to the oxide semiconductor layer.

Thus, when the oxide semiconductor layer is subjected to the heat treatment performed before forming the oxide insulating layer, and the heat treatment performed after forming the oxide insulating layer and the oxygen introduction, an i-type (intrinsic) oxide semiconductor layer or a substantially i-type oxide semiconductor layer from which impurities such as moisture and hydrogen are eliminated, can be obtained.

Consequently, variation in the electric characteristics of the transistor including the highly-purified oxide semiconductor layer is suppressed and the transistor is electrically stable. Therefore, a semiconductor device with high reliability can be provided.

Embodiment 7

A semiconductor device (also referred to as a display device) with a display function can be manufactured using the transistor an example of which is described in any of Embodiments 1 to 6. Some or all of driver circuits including the transistors can be formed over a substrate where a pixel portion is formed, whereby a system-on-panel can be obtained.

Figure 6A:
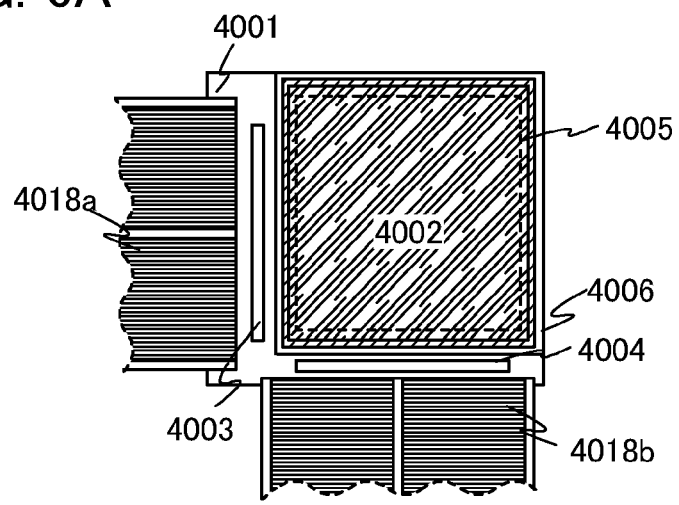
FIGS. 6A to 6C each show one embodiment of a semiconductor device.

In FIG. 6A, a sealant 4005 is provided to surround a pixel portion 4002 provided over a first substrate 4001, and the pixel portion 4002 is sealed with the sealant 4005 and the second substrate 4006. In FIG. 6A, a scan line driver circuit 4004 and a signal line driver circuit 4003 each are formed using a single crystal semiconductor film or a polycrystalline semiconductor film over a substrate prepared separately, and mounted in a region different from the region surrounded by the sealant 4005 over the first substrate 4001. Various signals and potentials are supplied to the signal line driver circuit 4003 and the scan line driver circuit 4004 each of which is separately formed, and the pixel portion 4002, from flexible printed circuits (FPCs) 4018a and 4018b.

Figure 6B:
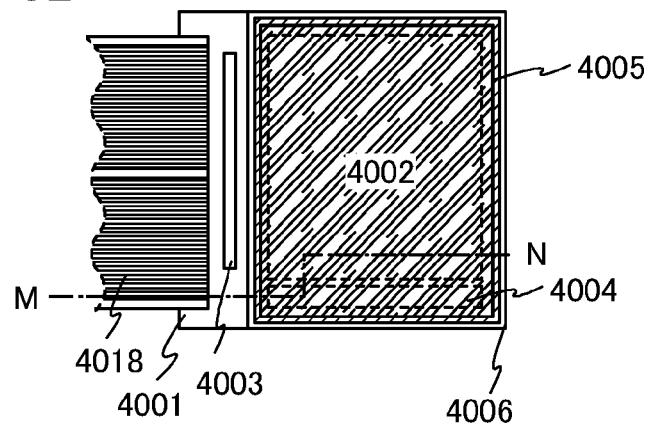
Figure 6C:
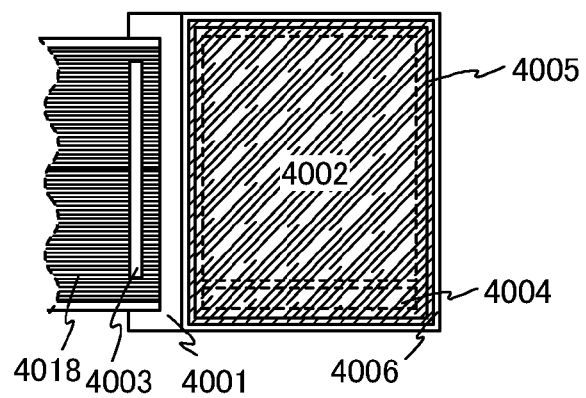

In FIGS. 6B and 6C, the sealant 4005 is provided to surround the pixel portion 4002 and the scan line driver circuit 4004 which are provided over the first substrate 4001. The second substrate 4006 is provided over the pixel portion 4002 and the scan line driver circuit 4004. Thus, the pixel portion 4002 and the scan line driver circuit 4004 are sealed together with a display element, by the first substrate 4001, the sealant 4005, and the second substrate 4006. In FIGS. 6B and 6C, the signal line driver circuit 4003 is formed using a single crystal semiconductor film or a polycrystalline semiconductor film over a substrate prepared separately, and mounted in a region different from the region surrounded by the sealant 4005 over the first substrate 4001. In FIGS. 6B and 6C, various signals and potentials are supplied to the separately formed signal line driver circuit 4003, the scan line driver circuit 4004, and the pixel portion 4002, from an FPC 4018.

Although FIGS. 6B and 6C each show the example in which the signal line driver circuit 4003 is formed separately and mounted on the first substrate 4001, the present invention is not limited to this structure. The scan line driver circuit may be separately formed and then mounted, or only part of the signal line driver circuit or part of the scan line driver circuit may be separately formed and then mounted.

Note that a method for connecting a separately formed driver circuit is not particularly limited, and a chip on glass (COG) method, a wire bonding method, a tape automated bonding (TAB) method, or the like can be used. FIG. 6A shows an example in which the signal line driver circuit 4003 and the scan line driver circuit 4004 are mounted by a COG method. FIG. 6B shows an example in which the signal line driver circuit 4003 is mounted by a COG method. FIG. 6C shows an example in which the signal line driver circuit 4003 is mounted by a TAB method.

The display device includes in its category a panel in which a display element is sealed, and a module in which an IC such as a controller is mounted on the panel.

Note that a display device in this specification means an image display device, a display device, or a light source (including a lighting device). The display device also includes the following modules in its category: a module in which a connector such as an FPC, a TAB tape, or a TCP is attached; a module having a TAB tape or a TCP at the tip of which a printed wiring board is provided; and a module in which an integrated circuit (IC) is directly mounted on a display element by a COG method.

The pixel portion and the scan line driver circuit provided over the first substrate include a plurality of transistors and any of the transistors which are described in Embodiments 1 to 6 can be applied.

As the display element provided in the display device, a liquid crystal element (also referred to as a liquid crystal display element) or a light-emitting element (also referred to as a light-emitting display element) can be used. The light-emitting element includes, in its category, an element whose luminance is controlled by a current or voltage, and specifically includes, in its category, an inorganic electroluminescent (EL) element, an organic EL element, and the like. Furthermore, a display medium whose contrast is changed by an electric effect, such as electronic ink, can be used.

Figure 7:
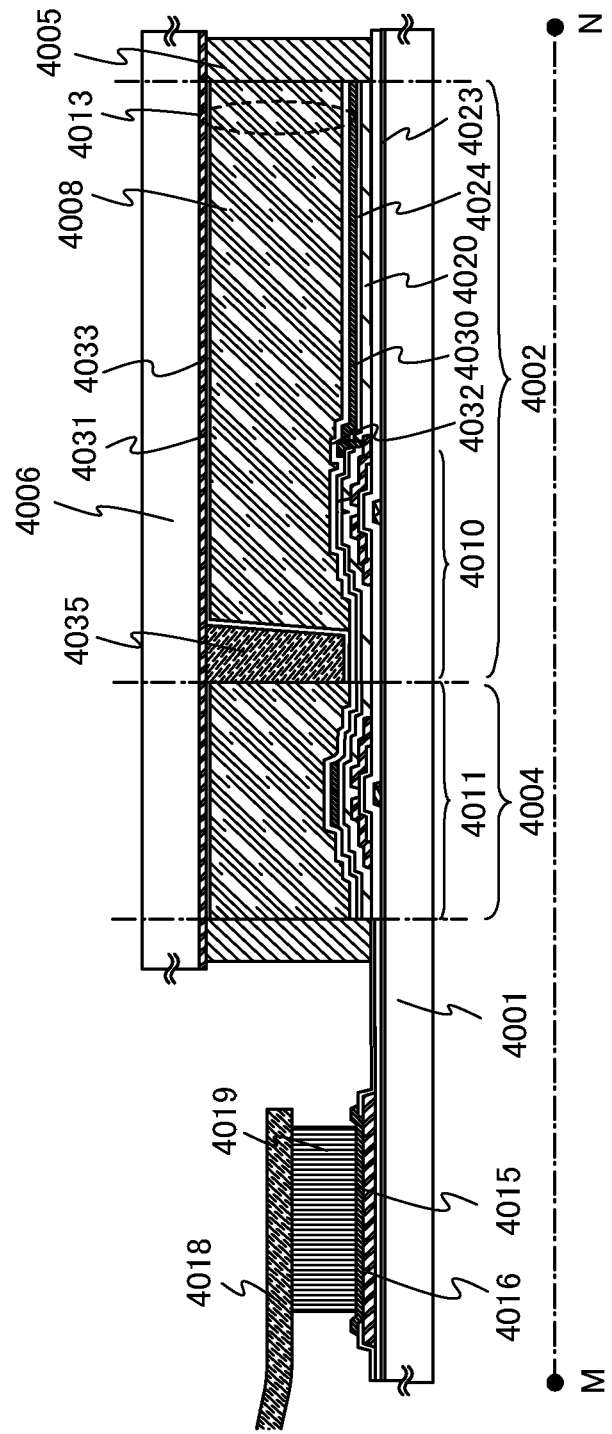
FIG. 7 shows one embodiment of a semiconductor device.
Figure 8:
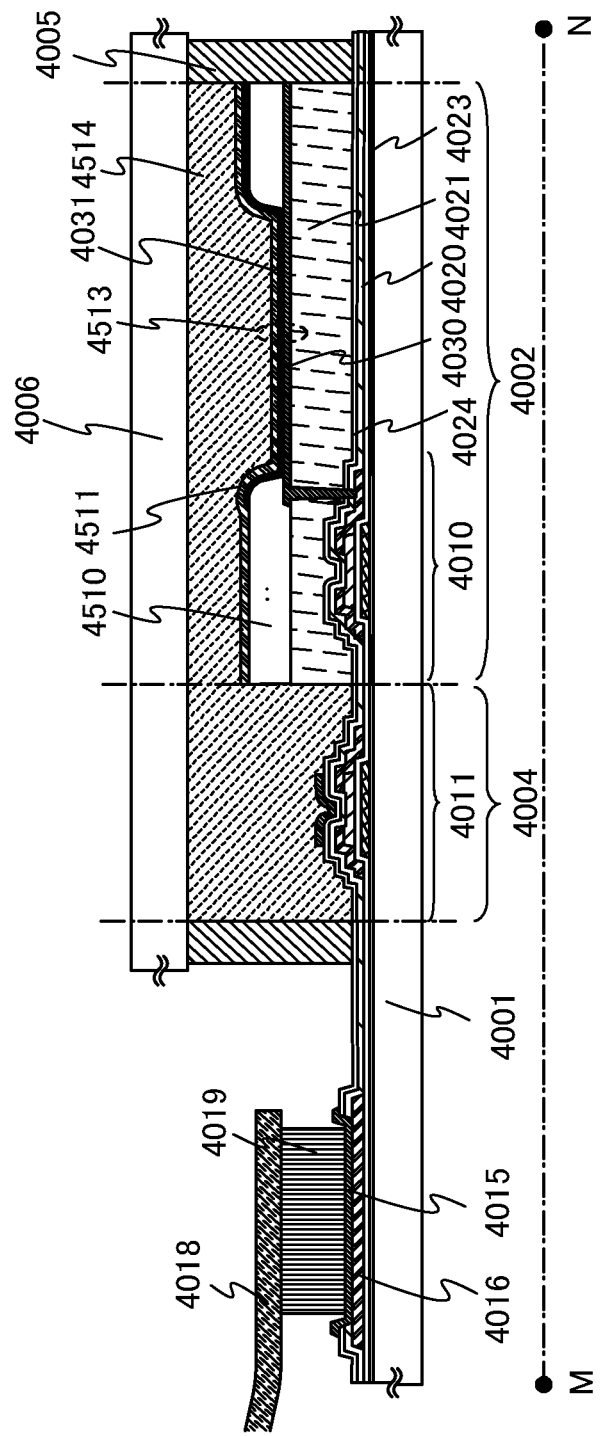
FIG. 8 shows one embodiment of a semiconductor device.
Figure 9:
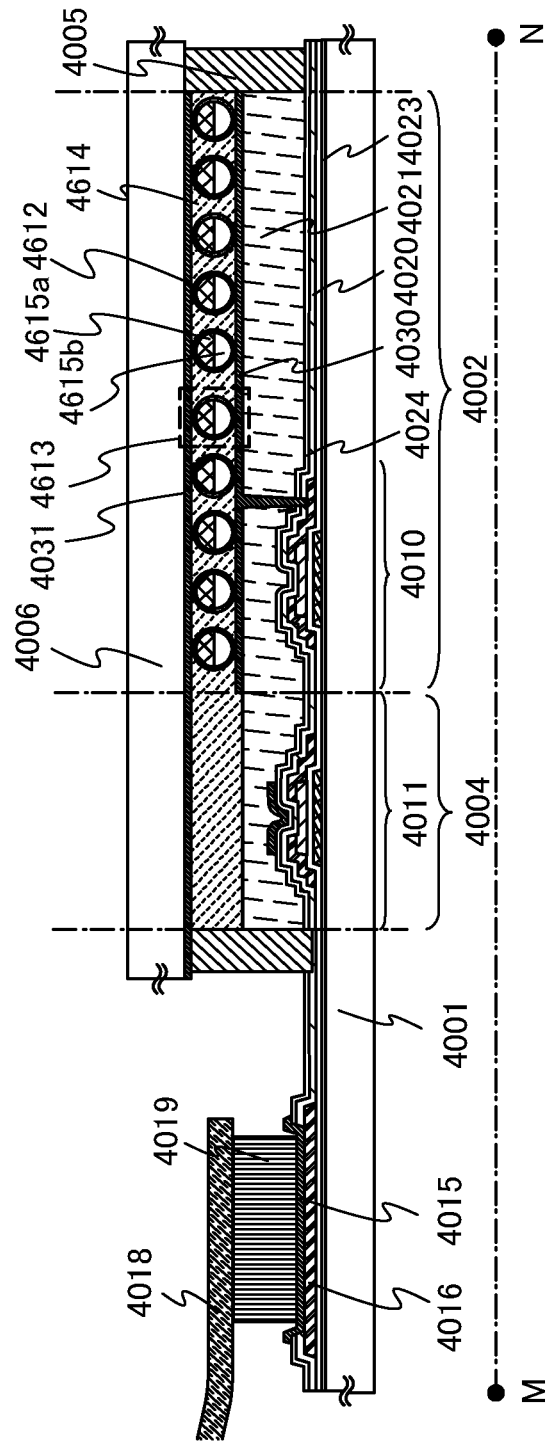
FIG. 9 shows one embodiment of a semiconductor device.

One embodiment of the semiconductor device is described with reference to FIG. 7, FIG. 8, and FIG. 9. FIG. 7 to FIG. 9 correspond to cross-sectional views taken along line M-N in FIG. 6B.

As shown in FIG. 7 to FIG. 9, the semiconductor device includes a connection terminal electrode 4015 and a terminal electrode 4016. The connection terminal electrode 4015 and the terminal electrode 4016 are electrically connected to a terminal included in the FPC 4018 through an anisotropic conductive film 4019.

The connection terminal electrode 4015 is formed of the same conductive film as a first electrode layer 4030. The terminal electrode 4016 is formed of the same conductive film as a source electrode layer and a drain electrode layer of transistors 4010 and 4011.

Each of the pixel portion 4002 and the scan line driver circuit 4004 provided over the first substrate 4001 includes a plurality of transistors. In FIG. 7 to FIG. 9, the transistor 4010 included in the pixel portion 4002 and the transistor 4011 included in the scan line driver circuit 4004 are shown as an example. In FIG. 7, an oxide insulating layer 4020 and a protective insulating layer 4024 are formed over the transistors 4010 and 4011. In FIG. 8 and FIG. 9, an insulating layer 4021 is further provided. Note that an insulating layer 4023 is an insulating film serving as a base film.

In this embodiment, any of the transistors shown in Embodiments 1 to 6 can be applied to the transistors 4010 and 4011.

In the transistors 4010 and 4011, the oxide semiconductor layer is an oxide semiconductor layer which is highly purified and from which impurities such as hydrogen, moisture, a hydroxyl group, or hydride (also referred to as a hydrogen compound) are intentionally removed by introducing oxygen through the oxide insulating layer 4020 stacked over the oxide semiconductor layer and performing heat treatment. By introducing oxygen, a bond between a metal included in the oxide semiconductor and hydrogen or a bond between the metal and a hydroxyl group is cut, and the hydrogen or the hydroxyl group is reacted with oxygen to produce water; this leads to easy elimination of hydrogen or a hydroxyl group that is an impurity, as water by the heat treatment performed later.

Oxygen is introduced to the oxide semiconductor layer through the oxide insulating layer 4020 stacked over the oxide semiconductor layer, so that an introduction (an introduction region) depth at which oxygen is introduced can be controlled and thus oxygen can be efficiently introduced to the oxide semiconductor layer.

The oxide semiconductor layer and the oxide insulating layer 4020 containing oxygen are in contact with each other when being subjected to the heat treatment; thus, oxygen, which is one of the major component of the oxide semiconductor and is reduced in the step of removing impurities, can be supplied from the oxide insulating layer 4020 containing oxygen to the oxide semiconductor layer. Thus, the oxide semiconductor layer is more highly purified to become electrically i-type (intrinsic).

Consequently, variation in the electric characteristics of the transistors 4010 and 4011 each including the highly-purified oxide semiconductor layer is suppressed and the transistors 4010 and 4011 are electrically stable. As described above, a semiconductor device with high reliability as the semiconductor devices shown in FIG. 7 to FIG. 9 can be obtained.

In this embodiment, examples are shown in which a conductive layer is provided over the insulating layer 4024 so as to overlap with a channel formation region of the oxide semiconductor layer of the transistor 4011 for the driver circuit. The conductive layer is provided at the position overlapping with the channel formation region of the oxide semiconductor layer, whereby the amount of change in the threshold voltage of the transistor 4011 between before and after a BT test can be further reduced. The conductive layer may have the same potential as or a potential different from that of a gate electrode layer of the transistor 4011, and can function as a second gate electrode layer. The potential of the conductive layer may be GND, 0 V, or in a floating state.

In addition, the conductive layer functions to block an external electric field, that is, to prevent an external electric field (particularly, to prevent static electricity) from effecting the inside (a circuit portion including a thin film transistor). A blocking function of the conductive layer can prevent variation in electric characteristics of the transistor due to the effect of external electric field such as static electricity.

The transistor 4010 provided in the pixel portion 4002 is electrically connected to the display element to constitute a display panel. A variety of display elements can be used as the display element as long as display can be performed.

An example of a liquid crystal display device using a liquid crystal element as a display element is shown in FIG. 7. In FIG. 7, a liquid crystal element 4013 is a display element including the first electrode layer 4030, a second electrode layer 4031, an insulating layer 4032, an insulating layer 4033, and a liquid crystal layer 4008. Note that the insulating layers 4032 and 4033 serving as alignment films are provided so that the liquid crystal layer 4008 is interposed therebetween. The second electrode layer 4031 is formed on the second substrate 4006 side. The first electrode layer 4030 and the second electrode layer 4031 are stacked with the liquid crystal layer 4008 interposed therebetween.

A columnar spacer denoted by reference numeral 4035 is obtained by selective etching of an insulating film and is provided in order to control the thickness (a cell gap) of the liquid crystal layer 4008. Alternatively, a spherical spacer may also be used.

In the case where a liquid crystal element is used as the display element, a thermotropic liquid crystal, a low-molecular liquid crystal, a high-molecular liquid crystal, a polymer dispersed liquid crystal, a ferroelectric liquid crystal, an antiferroelectric liquid crystal, or the like can be used. Such a liquid crystal material exhibits a cholesteric phase, a smectic phase, a cubic phase, a chiral nematic phase, an isotropic phase, or the like depending on conditions.

Alternatively, liquid crystal exhibiting a blue phase for which an alignment film is unnecessary may be used. A blue phase is one of liquid crystal phases generated just before a cholesteric phase changes into an isotropic phase while temperature of cholesteric liquid crystal is increased. Since the blue phase appears only in a narrow temperature range, a liquid crystal composition in which 5 wt % or more of a chiral material is mixed is used for the liquid crystal layer in order to improve the temperature range. The liquid crystal composition which includes a liquid crystal showing a blue phase and a chiral agent has a short response time of 1 msec or less, has optical isotropy, which makes the alignment process unneeded, and has a small viewing angle dependence. In addition, since an alignment film does not need to be provided and rubbing treatment is unnecessary, electrostatic discharge damage caused by the rubbing treatment can be prevented and defects and damage of the liquid crystal display device can be reduced in the manufacturing process. Thus, productivity of the liquid crystal display device can be increased. A transistor using an oxide semiconductor layer has the possibility that electrical characteristics of the transistor may significantly change and deviate from the designed range by the influence of static electricity. Therefore, it is more effective to use a liquid crystal material exhibiting a blue phase for the liquid crystal display device including a transistor which uses an oxide semiconductor layer.

The specific resistivity of the liquid crystal material is $1\times10^9$ Ω·cm or more, preferably $1\times10^{11}$ Ω·cm or more, more preferably $1\times10^{12}$ Ω·cm or more. Note that the specific resistivity in this specification is measured at 20° C.

The size of a storage capacitor provided in the liquid crystal display device is set considering the leakage current of the transistor provided in the pixel portion or the like so that charge can be held for a predetermined period. The size of the storage capacitor may be set considering the off-state current of the transistor or the like. Since the transistor including a high-purity oxide semiconductor layer is used, a storage capacitor having capacitance which is ⅓ or less, preferably ⅕ or less with respect to a liquid crystal capacitance of each pixel is sufficient to be provided.

In the transistor used in this embodiment, which uses a highly-purified oxide semiconductor layer, the current in an off state (the off-state current) can be made small. Therefore, an electrical signal such as an image signal can be held for a long period, and a writing interval can be set long when the power is on. Consequently, frequency of refresh operation can be reduced, which leads to an effect of suppressing power consumption.

The field-effect mobility of the transistor including a highly-purified oxide semiconductor layer used in this embodiment can be relatively high, whereby high-speed operation is possible. For example, when such a transistor which can operate at high speed is used for a liquid crystal display device, a switching transistor in a pixel portion and a driver transistor in a driver circuit portion can be formed over one substrate. That is, since a semiconductor device formed of a silicon wafer or the like is not additionally needed as a driver circuit, the number of components of the semiconductor device can be reduced. In addition, by using a transistor which can operate at high speed in a pixel portion, a high-quality image can be provided.

For the liquid crystal display device, a twisted nematic (TN) mode, an in-plane-switching (IPS) mode, a fringe field switching (FFS) mode, an axially symmetric aligned microcell (ASM) mode, an optical compensated birefringence (OCB) mode, a ferroelectric liquid crystal (FLC) mode, an antiferroelectric liquid crystal (AFLC) mode, and the like can be used.

A normally black liquid crystal display device such as a transmissive liquid crystal display device utilizing a vertical alignment (VA) mode is preferable. Some examples are given as a vertical alignment mode, for example, a multi-domain vertical alignment (MVA) mode, a patterned vertical alignment (PVA) mode, an ASV mode can be employed. Further, this embodiment can be applied to a VA liquid crystal display device. The VA liquid crystal display device has a kind of form in which alignment of liquid crystal molecules of a liquid crystal display panel is controlled. In the VA liquid crystal display device, liquid crystal molecules are aligned in a vertical direction with respect to a panel surface when no voltage is applied. Moreover, it is possible to use a method called domain multiplication or multi-domain design, in which a pixel is divided into some regions (subpixels) and molecules are aligned in different directions in their respective regions.

In the display device, a black matrix (a light-blocking layer), an optical member (an optical substrate) such as a polarizing member, a retardation member, or an anti-reflection member, and the like are provided as appropriate. For example, circular polarization may be obtained by using a polarizing substrate and a retardation substrate. A backlight, a side light, or the like may be used as a light source.

As a display method in the pixel portion, a progressive method, an interlace method, or the like can be employed. Color elements controlled in a pixel at the time of color display are not limited to three colors: R, G, and B (R, G, and B correspond to red, green, and blue respectively). For example, R, G, B, and W (W corresponds to white), or R, G, B, and one or more of yellow, cyan, magenta, and the like can be used. The sizes of display regions may be different between respective dots of color elements. Note that the present invention is not limited to the application to a display device for color display but can also be applied to a display device for monochrome display.

Alternatively, as the display element included in the display device, a light-emitting element utilizing electroluminescence can be used. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus the light-emitting organic compound is excited. The light-emitting organic compound returns to a ground state from the excited state, thereby emitting light. Owing to such a mechanism, such a light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that an example of an organic EL element as a light-emitting element is described here.

In order to extract light emitted from the light-emitting element, it is acceptable as long as at least one of a pair of electrodes is transparent. Then a transistor and a light-emitting element are formed over a substrate. The light-emitting element can have any of the following structure: a top emission structure in which light is extracted through the surface opposite to the substrate; a bottom emission structure in which light is extracted through the surface on the substrate side; or a dual emission structure in which light is extracted through the surface opposite to the substrate and the surface on the substrate side.

An example of a light-emitting device using a light-emitting element as a display element is shown in FIG. 8. A light-emitting element 4513 which is a display element is electrically connected to the transistor 4010 provided in the pixel portion 4002. The light-emitting element 4513 has a stacked-layer structure of the first electrode layer 4030, an electroluminescent layer 4511, and the second electrode layer 4031 but is not limited to this structure. The structure of the light-emitting element 4513 can be changed as appropriate depending on a direction in which light is extracted from the light-emitting element 4513, or the like.

A partition wall 4510 can be formed using an organic insulating material or an inorganic insulating material. It is particularly preferable that the partition wall 4510 be formed using a photosensitive resin material to have an opening portion over the first electrode layer 4030 so that a sidewall of the opening portion is formed as a tilted surface with continuous curvature.

The electroluminescent layer 4511 may be formed with either a single layer or a stacked layer of a plurality of layers.

A protective film may be formed over the second electrode layer 4031 and the partition wall 4510 in order to prevent entry of oxygen, hydrogen, moisture, carbon dioxide, or the like into the light-emitting element 4513. As the protective film, a silicon nitride film, a silicon nitride oxide film, a DLC film, or the like can be formed. In a space sealed with the first substrate 4001, the second substrate 4006, and the sealant 4005, a filler 4514 is provided and tightly sealed. It is preferable that the light-emitting element be packaged (sealed) with a cover material with high air-tightness and little degasification or a protective film (such as a laminate film or an ultraviolet curable resin film) so that the light-emitting element is not exposed to the outside air, in this manner.

As the filler 4514, an ultraviolet curable resin or a thermosetting resin can be used as well as an inert gas such as nitrogen or argon, and polyvinyl chloride (PVC), acrylic, polyimide, an epoxy resin, a silicone resin, polyvinyl butyral (PVB), ethylene vinyl acetate (EVA), or the like can be used. For example, nitrogen is used for the filler.

If needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

An electronic paper in which electronic ink is driven can be provided as the display device. The electronic paper is also called an electrophoretic display device (electrophoretic display) and has advantages in that it has the same level of readability as regular paper, it has less power consumption than other display devices, and it can be set to have a thin and light form.

An electrophoretic display device can have various modes. An electrophoretic display device contains a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

Thus, an electrophoretic display device is a display device that utilizes a so-called dielectrophoretic effect by which a substance having a high dielectric constant moves to a high-electric field region.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material of any of these.

As an electronic paper, a display device using a twisting ball display method can be used. The twisting ball display method refers to a method in which spherical particles each colored in white and black are arranged between a first electrode layer and a second electrode layer which are electrode layers used for a display element, and a potential difference is generated between the first electrode layer and the second electrode layer to control orientation of the spherical particles, so that display is performed.

FIG. 9 shows an active matrix electronic paper as one embodiment of a semiconductor device. The electronic paper in FIG. 9 is an example of a display device using a twisting ball display method. The twist ball display method refers to a method in which spherical particles each colored in white and black are arranged between electrode layers included in a display element, and a potential difference is generated between the electrode layers to control the orientation of the spherical particles, so that display is performed.

Between the first electrode layer 4030 connected to the transistor 4010 and the second electrode layer 4031 provided on the second substrate 4006, spherical particles 4613 each of which includes a black region 4615a, a white region 4615b, and a cavity 4612 around the regions which is filled with liquid, are provided. A space around the spherical particles 4613 is filled with a filler 4614 such as a resin. The second electrode layer 4031 corresponds to a common electrode (counter electrode). The second electrode layer 4031 is electrically connected to a common potential line.

Note that in FIG. 7 to FIG. 9, a flexible substrate as well as a glass substrate can be used as the first substrate 4001 and the second substrate 4006. For example, a plastic substrate having light-transmitting properties can be used. For plastic, a fiberglass-reinforced plastics (FRP) plate, a polyvinyl fluoride (PVF) film, a polyester film, or an acrylic resin film can be used. A sheet with a structure in which an aluminum foil is sandwiched between PVF films or polyester films can also be used.

The oxide insulating layer 4020 and the protective insulating layer 4024 function as protective films of a transistor.

In addition, the oxide insulating layer 4020 has a function of supplying the oxide semiconductor layer with oxygen which is reduced in the step of removing impurities such as hydrogen, moisture, a hydroxyl group, and hydride.

As the oxide insulating layer 4020, an insulating layer containing much oxygen such as a silicon oxide layer, a silicon oxynitride layer may be formed by a sputtering method.

Note that the protective insulating layer 4024 prevents contaminant impurities such as an organic substance, a metal, or water vapor included in the atmosphere from entering; thus, a dense film is preferably used for the protective insulating layer 4024. As the protective insulating layer 4024, a single layer or a stacked layer of a silicon nitride film, a silicon oxynitride film, an aluminum oxide film, an aluminum nitride film, an aluminum oxynitride film, or an aluminum nitride oxide film may be formed by a sputtering method.

The insulating layer 4021 serving as a planarizing insulating film can be formed using an organic material having heat resistance, such as acrylic, polyimide, benzocyclobutene, polyamide, or epoxy. Other than such organic materials, it is also possible to use a low-dielectric constant material (a low-k material), a siloxane-based resin, PSG (phosphosilicate glass), BPSG (borophosphosilicate glass), or the like. Note that the insulating layer may be formed by stacking a plurality of insulating films formed of these materials.

There is no particular limitation on the method for forming the oxide insulating layer 4020, the protective insulating layer 4024, and the insulating layer 4021, and any of the following can be used depending on a material thereof: a method such as a sputtering method, an SOG method, spin coating, dipping, spray coating, or a droplet discharging method (e.g., an inkjet method, screen printing, or offset printing); a tool (equipment) such as doctor knife, roll coater, curtain coater, or knife coater; or the like.

The display device performs display by transmitting light from a light source or a display element. Thus, the substrates and the thin films such as insulating films and conductive films provided in the pixel portion where light is transmitted have light-transmitting properties with respect to light in the visible-light wavelength range.

The first electrode layer 4030 and the second electrode layer 4031 (each of which may be called a pixel electrode layer, a common electrode layer, a counter electrode layer, or the like) for applying voltage to the display element may have light-transmitting properties or light-reflecting properties, which depends on the direction in which light is extracted, the position where the electrode layer is provided, and the pattern structure of the electrode layer.

A light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added, can be used for the first electrode layer 4030 and the second electrode layer 4031.

The first electrode layer 4030 and the second electrode layer 4031 can be formed using one kind or plural kinds selected from metal such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), or silver (Ag); an alloy thereof; and a nitride thereof.

A conductive composition containing a conductive high molecule (also referred to as a conductive polymer) can be used for the first electrode layer 4030 and the second electrode layer 4031. As the conductive high molecule, a so-called π-electron conjugated conductive polymer can be used. For example, polyaniline or a derivative thereof, polypyrrole or a derivative thereof, polythiophene or a derivative thereof, a copolymer of two or more of aniline, pyrrole, and thiophene or a derivative thereof can be given.

Since the transistor is easily broken due to static electricity or the like, a protective circuit for protecting the driver circuit is preferably provided. The protective circuit is preferably formed using a nonlinear element.

As described above, by using any of the transistors shown in Embodiments 1 to 6, a semiconductor device having a variety of functions can be provided.

Embodiment 8

When any of the transistors shown in Embodiments 1 to 6 is used, a semiconductor device having an image sensor function for reading data of an object can be manufactured.

Figure 10A:
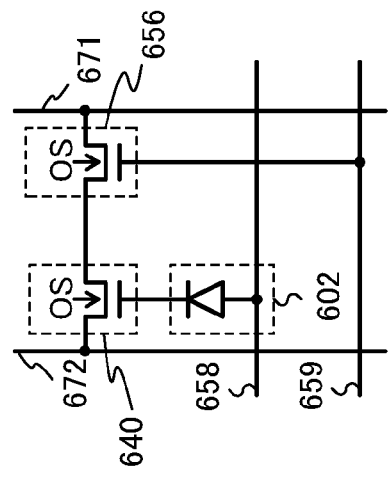
FIGS. 10A and 10B show one embodiment of a semiconductor device.

FIG. 10A shows an example of a semiconductor device having an image sensor function. FIG. 10A is an equivalent circuit of a photo sensor and FIG. 10B is a cross-sectional view showing part of the photo sensor.

In a photodiode 602, one electrode is electrically connected to a photodiode reset signal line 658, and the other electrode is electrically connected to a gate of a transistor 640. One of a source and a drain of the transistor 640 is electrically connected to a photo sensor reference signal line 672, and the other of the source and the drain thereof is electrically connected to one of a source and a drain of a transistor 656. A gate of the transistor 656 is electrically connected to a gate signal line 659, and the other of the source and the drain thereof is electrically connected to a photo sensor output signal line 671.

Note that in circuit diagrams in this specification, a transistor using an oxide semiconductor layer is denoted by a symbol "OS" so that it can be identified as a transistors including an oxide semiconductor layer. In FIG. 10A, the transistor 640 and the transistor 656 are transistors using an oxide semiconductor layer.

Figure 10B:
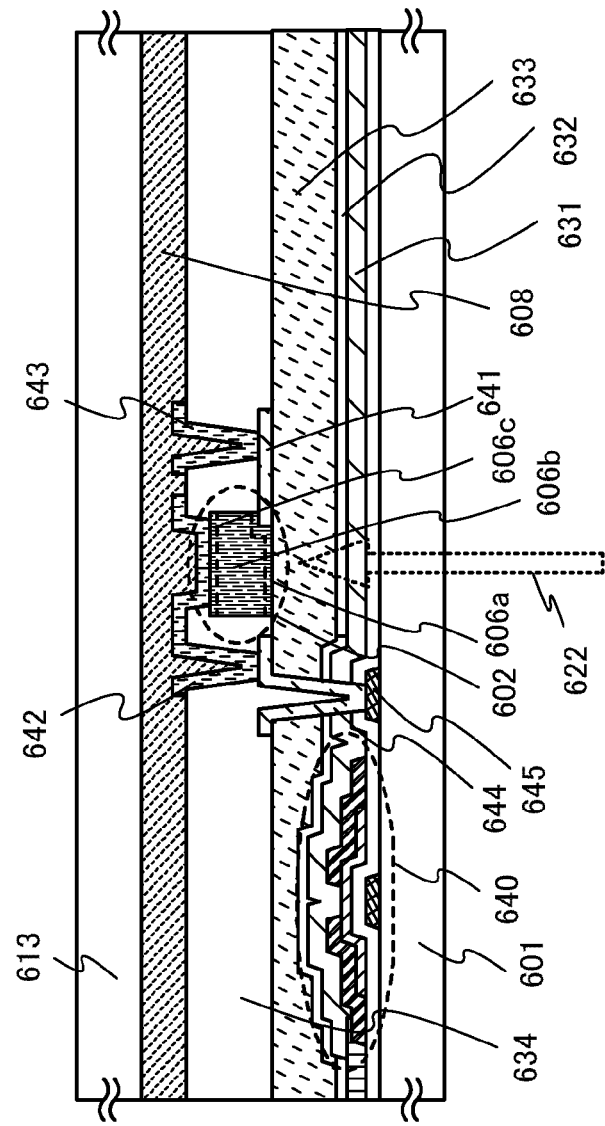

FIG. 10B is a cross-sectional view of the photodiode 602 and the transistor 640 in a photo sensor. The photodiode 602 functioning as a sensor and the transistor 640 are provided over a substrate 601 (a TFT substrate) having an insulating surface. A substrate 613 is provided over the photodiode 602 and the transistor 640 with an adhesive layer 608 interposed therebetween.

An insulating layer 631, a protective insulating layer 632, an interlayer insulating layer 633, and an interlayer insulating layer 634 are provided over the transistor 640. The photodiode 602 is provided over the interlayer insulating layer 633. In the photodiode 602, a first semiconductor layer 606a, a second semiconductor layer 606b, and a third semiconductor layer 606c are sequentially stacked from the interlayer insulating layer 633 side, between an electrode layer 641 formed over the interlayer insulating layer 633 and an electrode layer 642 formed over the interlayer insulating layer 634.

The electrode layer 641 is electrically connected to a conductive layer 643 formed in the interlayer insulating layer 634, and the electrode layer 642 is electrically connected to a gate electrode layer 645 through the electrode layer 644. The gate electrode layer 645 is electrically connected to a gate electrode layer of the transistor 640, and the photodiode 602 is electrically connected to the transistor 640.

Here, a PIN photodiode in which a semiconductor layer having p-type conductivity as the first semiconductor layer 606a, a high-resistance semiconductor layer (i-type semiconductor layer) as the second semiconductor layer 606b, and a semiconductor layer having n-type conductivity as the third semiconductor layer 606c are stacked is shown as an example.

The first semiconductor layer 606a is a p-type semiconductor layer and can be formed using an amorphous silicon film containing an impurity element imparting p-type conductivity. The first semiconductor layer 606a is formed by a plasma CVD method with use of a semiconductor source gas containing an impurity element belonging to Group 13 (such as boron (B)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then, an impurity element may be introduced to the amorphous silicon film with use of a diffusion method or an ion implantation method. Heating or the like may be conducted after introducing the impurity element by an ion implantation method or the like in order to diffuse the impurity element. In this case, as a method for forming the amorphous silicon film, an LPCVD method, a vapor film formation method, a sputtering method, or the like may be used. The first semiconductor layer 606a is preferably formed to have a thickness of 10 nm to 50 nm inclusive.

The second semiconductor layer 606b is an i-type semiconductor layer (intrinsic semiconductor layer) and is formed using an amorphous silicon film. As for formation of the second semiconductor layer 606b, an amorphous silicon film is formed with use of a semiconductor source gas by a plasma CVD method. As the semiconductor source gas, silane ($SiH_4$) may be used. Alternatively, $Si_2H_6$, $SiH_2Cl_2$, $SiHCl_3$, $SiCl_4$, $SiF_4$, or the like may be used. The second semiconductor layer 606b may be alternatively formed by an LPCVD method, a vapor film formation method, a sputtering method, or the like. The second semiconductor layer 606b is preferably formed to have a thickness of 200 nm to 1000 nm inclusive.

The third semiconductor layer 606c is an n-type semiconductor layer and is formed using an amorphous silicon film containing an impurity element imparting n-type conductivity. The third semiconductor layer 606c is formed by a plasma CVD method with use of a semiconductor source gas containing an impurity element belonging to Group 15 (e.g., phosphorus (P)). As the semiconductor source gas, silane ($SiH_4$) may be used. Alternatively, $Si_2H_6$, $SiH_2Cl_2$, $SiHCl_3$, $SiCl_4$, $SiF_4$, or the like may be used. Further alternatively, an amorphous silicon film which does not contain an impurity element may be formed, and then, an impurity element may be introduced to the amorphous silicon film with use of a diffusion method or an ion implantation method. Heating or the like may be conducted after introducing the impurity element by an ion implantation method or the like in order to diffuse the impurity element. In this case, as a method for forming the amorphous silicon film, an LPCVD method, a vapor film formation method, a sputtering method, or the like may be used. The third semiconductor layer 606c is preferably formed to have a thickness of 20 nm to 200 nm inclusive.

The first semiconductor layer 606a, the second semiconductor layer 606b, and the third semiconductor layer 606c are not necessarily formed using an amorphous semiconductor, and they may be formed using a polycrystalline semiconductor, a microcrystalline semiconductor (a semi-amorphous semiconductor (SAS)).

The microcrystalline semiconductor belongs to a metastable state of an intermediate between amorphous and single crystalline when Gibbs free energy is considered. That is, the microcrystalline semiconductor is a semiconductor having a third state which is stable in terms of free energy and has a short range order and lattice distortion. Columnar-like or needle-like crystals grow in a normal direction with respect to a substrate surface. The Raman spectrum of microcrystalline silicon, which is a typical example of a microcrystalline semiconductor, is located in lower wave numbers than 520 $cm^{-1}$, which represents a peak of the Raman spectrum of single crystal silicon. That is, the peak of the Raman spectrum of the microcrystalline silicon exists between 520 $cm^{-1}$ which represents single crystal silicon and 480 $cm^{-1}$ which represents amorphous silicon. In addition, the microcrystalline silicon contains hydrogen or halogen of at least 1 at. % or more in order to terminate a dangling bond. Moreover, the microcrystalline silicon contains a rare gas element such as helium, argon, krypton, or neon to further promote lattice distortion, so that stability is increased and a favorable microcrystalline semiconductor film can be obtained.

This microcrystalline semiconductor film can be formed by a high-frequency plasma CVD method with a frequency of several tens to several hundreds of megahertz or a microwave plasma CVD method with a frequency of 1 GHz or more. Typically, the microcrystalline semiconductor film can be formed using silicon hydride such as $SiH_4$, $Si_2H_6$, $SiH_2Cl_2$, $SiHCl_3$, $SiCl_4$, or $SiF_4$, which is diluted with hydrogen. With a dilution with one kind or plural kinds of rare gas elements selected from helium, argon, krypton, or neon in addition to silicon hydride and hydrogen, the microcrystalline semiconductor film can be formed. In that case, the flow ratio of hydrogen to silicon hydride is 5:1 to 200:1, preferably 50:1 to 150:1, more preferably 100:1. Further, a carbide gas such as $CH_4$ or $C_2H_6$, a germanium gas such as $GeH_4$ or $GeF_4$, $F_2$, or the like may be mixed into the gas containing silicon.

Since the mobility of holes generated by the photoelectric effect is lower than that of electrons, a PIN photodiode has better characteristics when a surface on the p-type semiconductor layer side is used as a light-receiving plane. Here, an example where light 622 received by the photodiode 602 from a surface of the substrate 601, over which a PIN photodiode is formed, is converted into electric signals will be described. Light approaching the semiconductor layer side having a conductivity type opposite from that of the semiconductor layer side on the light-receiving plane is disturbance light; therefore, the electrode layer is preferably formed from a light-blocking conductive film. A surface of the n-type semiconductor layer side can alternatively be used as the light-receiving plane.

With the use of an insulating material, the insulating layer 631, the protective insulating layer 632, the interlayer insulating layer 633, and the interlayer insulating layer 634 can be formed, depending on the material, with a method such as a sputtering method, an SOG method, spin coating, dipping, spray coating, or a droplet discharge method (e.g., an inkjet method, screen printing, offset printing, or the like), or a tool (equipment) such as a doctor knife, a roll coater, a curtain coater, or a knife coater.

As the insulating layer 631, a single layer or a stacked layer of an oxide insulating layer such as a silicon oxide layer, a silicon oxynitride layer, an aluminum oxide layer, an aluminum oxynitride layer, or the like can be used.

As an inorganic insulating material of the protective insulating layer 632, a single layer or a stacked layer of a nitride insulating layer such as a silicon nitride layer, a silicon nitride oxide layer, an aluminum nitride layer, an aluminum nitride oxide layer, or the like can be used. High-density plasma CVD with use of microwaves (2.45 GHz) is preferably employed since formation of a dense and high-quality insulating layer having high breakdown voltage is possible.

For reduction of the surface roughness, an insulating layer functioning as a planarization insulating film is preferably used as the interlayer insulating layers 633 and 634. For the interlayer insulating layers 633 and 634, an organic insulating material having heat resistance such as polyimide, acrylic resin, benzocyclobutene resin, polyamide, or epoxy resin can be used. Other than such organic insulating materials, it is possible to use a single layer or stacked layers of a low-dielectric constant material (a low-k material), a siloxane-based resin, phosphosilicate glass (PSG), borophosphosilicate glass (BPSG), or the like.

By detecting light 622 entering the photodiode 602, data of an object can be read. Note that a light source such as a backlight can be used at the time of reading data of an object.

Transistors shown as an example in Embodiments 1 to 6 can be used as the transistor 640. A transistor including an oxide layer highly purified by intentionally eliminating impurities such as hydrogen, moisture, a hydroxyl group, or hydride (also referred to as a hydrogen compound) from an oxide semiconductor layer has a suppressed variation in electric characteristics and is electrically stable. Consequently, a semiconductor device with high reliability can be provided.

This embodiment can be implemented in appropriate combination with the structures described in the other embodiments.

Embodiment 9

A liquid crystal display device disclosed in this specification can be applied to a variety of electronic devices (including game machines). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large-sized game machine such as a pachinko machine, and the like. Examples of electronic devices including the liquid crystal display device described in any of the above embodiments will be described.

Figure 11A:
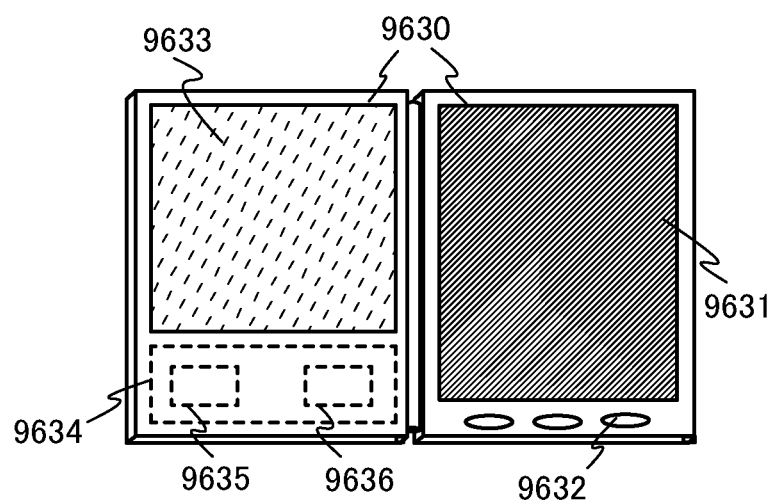
FIGS. 11A and 11B show an electronic device.

FIG. 11A shows an electronic book reader (also referred to as an e-book reader) which can include housings 9630, a display portion 9631, operation keys 9632, a solar cell 9633, and a charge and discharge control circuit 9634. The e-book reader shown in FIG. 11A has a function of displaying various kinds of information (e.g., a still image, a moving image, and a text image) on the display portion, a function of displaying a calendar, a date, the time, or the like on the display portion, a function of operating or editing the information displayed on the display portion, a function of controlling processing by various kinds of software (programs), and the like. Note that, in FIG. 11A, the charge and discharge control circuit 9634 has a battery 9635 and a DCDC converter (hereinafter, abbreviated as a converter) 9636 as an example. When the semiconductor device shown in any of Embodiments 1 to 8 is applied to the display portion 9631, a highly reliable e-book reader can be obtained.

In the case of using a transflective or reflective liquid crystal display device as the display portion 9631 in the structure shown in FIG. 11A, the e-book reader may be used in a comparatively bright environment. In that case, power generation by the solar cell 9633 and charge by the battery 9635 can be effectively performed, which is preferable. Since the solar cell 9633 can be provided on a space (a surface or a rear surface) of the housing 9630 as appropriate, the battery 9635 can be efficiently charged, which is preferable. When a lithium ion battery is used as the battery 9635, there is an advantage of downsizing or the like.

Figure 11B:
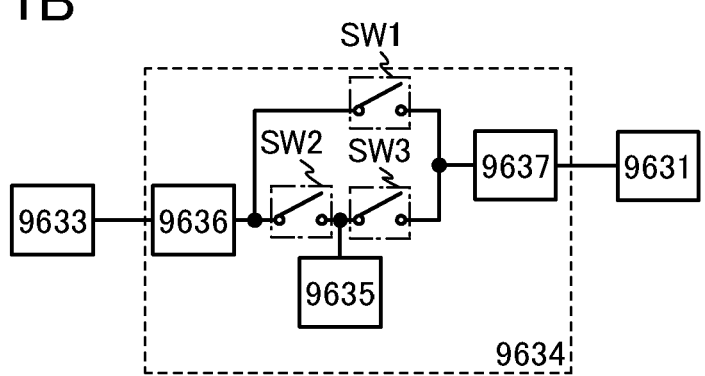

A configuration and operation of the charge and discharge control circuit 9634 shown in FIG. 11A is described with reference to a block diagram of FIG. 11B. FIG. 11B shows the solar cell 9633, the battery 9635, the converter 9636, a converter 9637, switches SW1 to SW3, and the display portion 9631. The charge and discharge control circuit 9634 includes the battery 9635, the converter 9636, the converter 9637, and the switches SW1 to SW3.

First, explanation is given to an operation example in the case where the solar cell 9633 generates power by using external light. The power generated by the solar cell 9633 is raised or lowered by the converter 9636 to be the voltage which is stored in the battery 9635. When the power from the solar cell 9633 is used for operation of the display portion 9631, the switch SW1 is turned on and the power is raised or lowered by the converter 9637 to be the voltage needed for the display portion 9631. When display is not performed on the display portion 9631, the switch SW1 may be turned off and the switch SW2 may be turned on, whereby the battery 9635 is charged.

Next, an example of operation is described for the case when the solar cell 9633 does not generate power by using external light. The power stored in the battery 9635 is raised or lowered by the converter 9637 when the switch SW3 is turned on. Then, the power from the battery 9635 is used for operation of the display portion 9631.

Note that the solar cell 9633 is shown as an example of a charging unit here; however, charging the battery 9635 may be performed by another unit. Alternatively, a combination of another charging unit may be used.

Figure 12A:
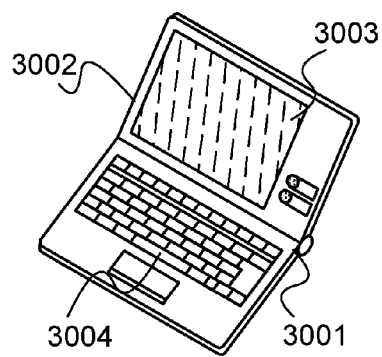
FIGS. 12A to 12F each show an electronic device.

FIG. 12A shows a laptop personal computer including a main body 3001, a housing 3002, a display portion 3003, a keyboard 3004, and the like. When the semiconductor device shown in any of Embodiments 1 to 8 is applied to the display portion 3003, a highly reliable laptop personal computer can be obtained.

Figure 12B:
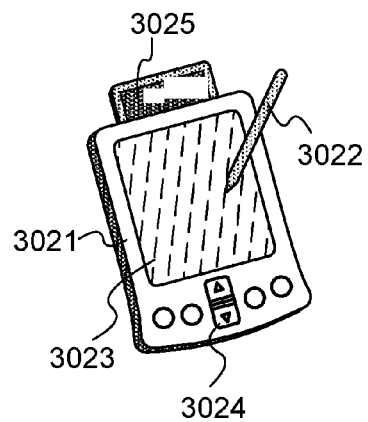

FIG. 12B is a portable information terminal (PDA) including a display portion 3023, an external interface 3025, an operation button 3024, and the like in a main body 3021. A stylus 3022 is included as an accessory for operation. By applying the semiconductor device shown in any of Embodiments 1 to 8 to the display portion 3023, a portable information terminal (PDA) with higher reliability can be obtained.

Figure 12C:
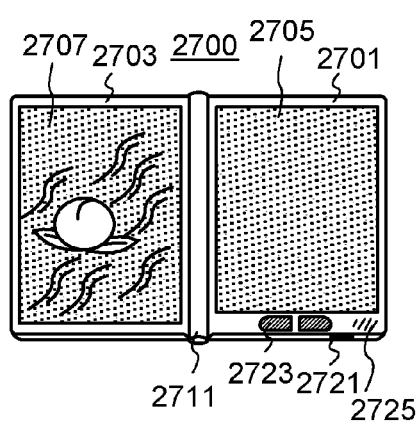

FIG. 12C is an example of an e-book reader. For example, the e-book reader 2700 includes two housings, a housing 2701 and a housing 2703. The housing 2701 and the housing 2703 are combined with a hinge 2711 so that the e-book reader 2700 can be opened and closed with the hinge 2711 as an axis. With such a structure, the e-book reader 2700 can operate like a paper book.

A display portion 2705 and a display portion 2707 are incorporated in the housing 2701 and the housing 2703 respectively. The display portion 2705 and the display portion 2707 may display one image or different images. In the structure where different images are displayed on different display portions, for example, the right display portion (the display portion 2705 in FIG. 12C) can display text and the left display portion (the display portion 2707 in FIG. 12C) can display images. When the semiconductor device shown in any of Embodiments 1 to 8 is applied to the display portions 2705 and 2707, the e-book reader 2700 with high reliability can be obtained.

FIG. 12C shows an example in which the housing 2701 is provided with an operation portion and the like. For example, the housing 2701 is provided with a power switch 2721, operation keys 2723, a speaker 2725, and the like. With the operation keys 2723, pages can be turned. Note that a keyboard, a pointing device, or the like may also be provided on the surface of the housing, on which the display portion is provided. Further, an external connection terminal (an earphone terminal, a USB terminal, or the like), a recording medium insertion portion, and the like may be provided on the back surface or the side surface of the housing. Moreover, the e-book reader 2700 may have a function of an electronic dictionary.

The e-book reader 2700 may have a configuration capable of wirelessly transmitting and receiving data. Through wireless communication, desired book data or the like can be purchased and downloaded from an electronic book server.

Figure 12D:
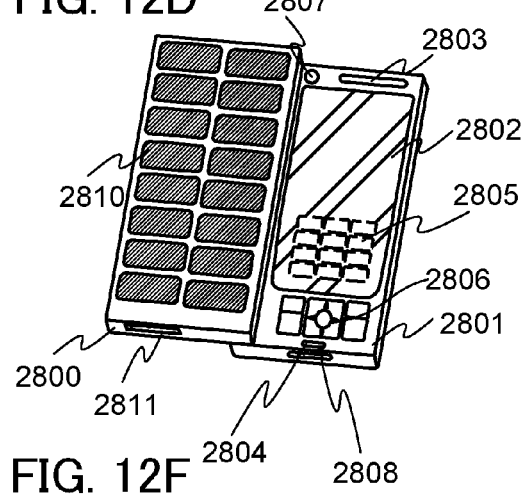

FIG. 12D is a mobile phone including two housings, a housing 2800 and a housing 2801. The housing 2801 includes a display panel 2802, a speaker 2803, a microphone 2804, a pointing device 2806, a camera lens 2807, an external connection terminal 2808, and the like. The housing 2800 includes a solar cell 2810 having a function of charge of the portable information terminal, an external memory slot 2811, and the like. In addition an antenna is incorporated in the housing 2801. When the semiconductor device shown in any of Embodiments 1 to 8 is applied to the display panel 2802, a highly reliable mobile phone can be obtained.

Further, the display panel 2802 is provided with a touch panel. A plurality of operation keys 2805 which is displayed is indicated by dashed lines in FIG. 12D. Note that a boosting circuit by which voltage output from the solar cell 2810 is increased to be sufficiently high for each circuit is also included.

In the display panel 2802, the display direction can be appropriately changed depending on a usage pattern. The mobile phone is provided with the camera lens 2807 on the same surface as the display panel 2802, and thus it can be used as a video phone. The speaker 2803 and the microphone 2804 can be used for videophone calls, recording and playing sound, and the like as well as voice calls. Moreover, the housings 2800 and 2801 in a state where they are developed as shown in FIG. 12D can shift by sliding so that one is lapped over the other; therefore, the size of the mobile phone can be reduced, which makes the mobile phone suitable for being carried.

The external connection terminal 2808 can be connected to an AC adapter and various types of cables such as a USB cable, and charging and data communication with a personal computer are possible. Further, a large amount of data can be stored by inserting a storage medium into the external memory slot 2811 and can be moved.

In addition to the above functions, an infrared communication function, a television reception function, or the like may be provided.

Figure 12E:
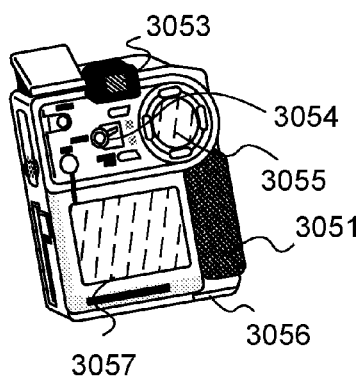

FIG. 12E is a digital video camera including a main body 3051, a display portion A 3057, an eyepiece 3053, an operation switch 3054, a display portion B 3055, a battery 3056, and the like. When the semiconductor device shown in any of Embodiments 1 to 8 is applied to the display portion A 3057 and the display portion B 3055, a highly reliable digital video camera can be obtained.

Figure 12F:
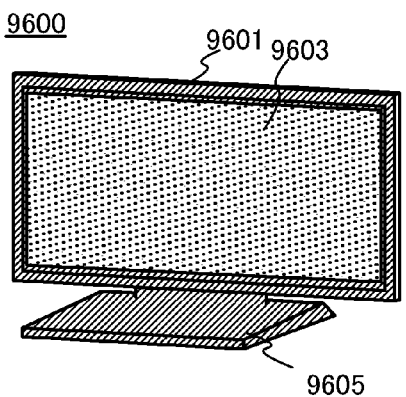

FIG. 12F shows an example of a television set. In a television set 9600, a display portion 9603 is incorporated in a housing 9601. The display portion 9603 can display images. Here, the housing 9601 is supported by a stand 9605. When the semiconductor device shown in any of Embodiments 1 to 8 is applied to the display portion 9603, the television set 9600 with high reliability can be obtained.

The television set 9600 can be operated by an operation switch included in the housing 9601 or a separate remote controller. The remote controller may be provided with a display portion for displaying data output from the remote controller.

Note that the television set 9600 is provided with a receiver, a modem, and the like. With the use of the receiver, general television broadcasting can be received. Moreover, when the display device is connected to a communication network with or without wires via the modem, one-way (from a sender to a receiver) or two-way (between a sender and a receiver or between receivers) information communication can be performed.

This embodiment can be implemented in appropriate combination with the structures described in the other embodiments.

Example 1

In this example, the top-gate transistor shown in FIG. 4B in Embodiment 4 was manufactured. At the same time, a test element group (TEG) for evaluating a sheet resistance was manufactured, and the sheet resistance of an oxide semiconductor layer to which oxygen was introduced was evaluated. First, a method for manufacturing the transistor and the TEG is described with reference to FIGS. 13A and 13B.

Figure 13A:
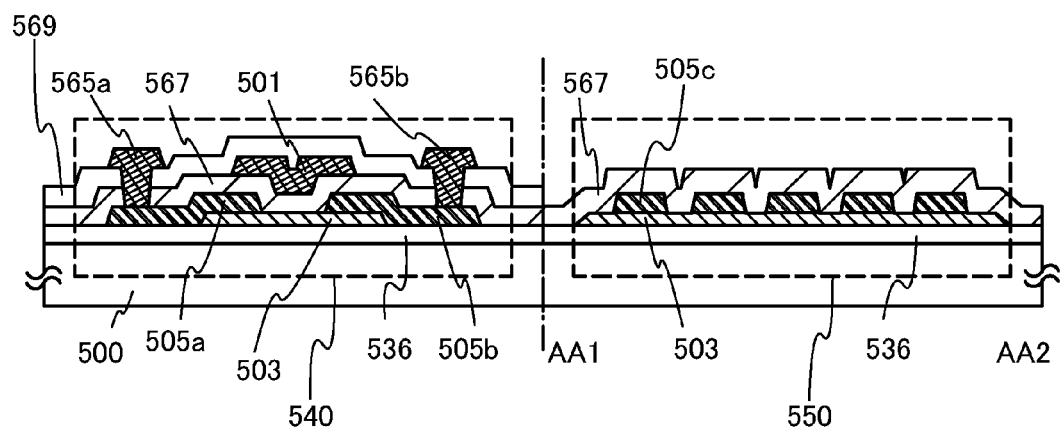
FIGS. 13A and 13B show one embodiment of a semiconductor device.

As shown in FIG. 13A, a transistor 540 includes a base layer 536, an oxide semiconductor layer 503, a source electrode layer 505a, a drain electrode layer 505b, a gate insulating layer 567, a gate electrode layer 501, a protective insulating layer 569, a wiring layer 565a, and a wiring layer 565b, which are formed over a substrate 500 having an insulating surface.

A TEG 550 includes the base layer 536, the oxide semiconductor layer 503, an electrode layer 505c formed at the same time as the source electrode layer 505a and the drain electrode layer 505b, and the gate insulating layer 567, which are formed over the substrate 500 having an insulating surface. Note that the TEG 550 shown in FIG. 13A is a cross-sectional view corresponding to a dashed line AA1-AA2 shown in FIG. 13B.

Figure 13B:
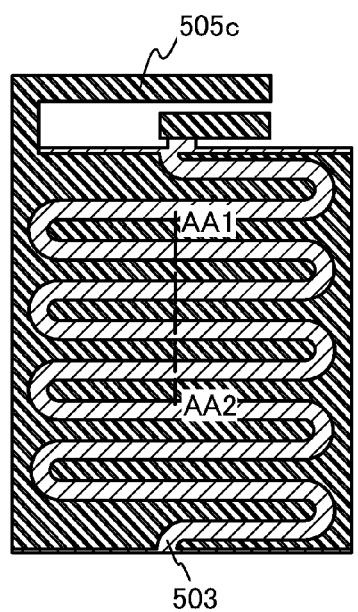

FIG. 13B shows a plan view of the TEG 550 shown in FIG. 13A. Over the oxide semiconductor layer 503, the comb-shaped electrode layer 505c is formed. The sheet resistance of the oxide semiconductor layer 503 can be measured by applying a potential to the electrode layer 505c. A region where the electrode layer 505c is not formed has a size of L/W=100 µm/50000 µm.

Next, the method for manufacturing the transistor 540 and the TEG 550 shown in FIGS. 13A and 13B is described.

First, as the base layer 536, a silicon oxide film (having a thickness of 300 nm) was formed over the substrate 500 by a sputtering method at 100° C.

Next, an oxide semiconductor layer having a thickness of 30 nm was formed over the base layer 536 using an In—Ga—Zn—O-based metal oxide target ($In_2O_3$:$Ga_2O_3$:ZnO=1:1:1). The oxide semiconductor layer was formed under the following conditions: the pressure was 0.4 Pa, the direct current (DC) power supply was 0.5 kW, the atmosphere was an atmosphere containing argon and oxygen (argon:oxygen=30 sccm:15 sccm), and the temperature was 200° C.

The oxide semiconductor layer was etched selectively, thereby forming the island-shaped oxide semiconductor layer 503. After that, as a conductive film functioning as a source electrode layer and a drain electrode layer, a tungsten film (having a thickness of 50 nm) was formed over the oxide semiconductor layer 503 by a sputtering method at 200° C. Here, the tungsten film was selectively etched to form the source electrode layer 505a, the drain electrode layer 505b, and the electrode layer 505c.

The gate insulating layer 567 was formed over the source electrode layer 505a, the drain electrode layer 505b, the electrode layer 505c, the oxide semiconductor layer 503 parts of which are exposed, and the base layer 536. A silicon oxynitride film (having a thickness of 30 nm) was formed as the gate insulating layer 567 by a plasma CVD method. Note that in this example, the protective insulating layer functioning as a gate insulating layer shown in FIG. 4B is not formed.

Oxygen was introduced to the oxide semiconductor layer 503 through the gate insulating layer 567 (oxygen introduction). An ion implantation method was used for the oxygen introduction. The treatment was performed at an accelerating voltage of 25 keV using $^{16}O_2$ ($^{16}O^+$) as a source gas. Note that the oxygen introduction was performed under three conditions: without oxygen introduction, oxygen introduction at a dose of $4.5 \times 10^{14}$ ions/cm$^2$, and oxygen introduction at a dose of $4.5 \times 10^{15}$ ions/cm$^2$, and three samples were formed.

After first heat treatment was performed under a nitrogen atmosphere at 450° C. for one hour, with use of a sputtering apparatus, a stacked layer of a tantalum nitride film (having a thickness of 30 nm) and a tungsten film (having a thickness of 370 nm) was formed as a gate electrode layer over the gate insulating layer 567. Then, the stacked layer was selectively etched, thereby forming the gate electrode layer 501.

A silicon oxide film (having a thickness of 300 nm) was formed as the protective insulating layer 569 by a sputtering method at 200° C. so as to be in contact with the gate electrode layer 501 and the gate insulating layer 567. Here, the silicon oxide film which is the protective insulating layer 569 and the gate insulating layer 567 were selectively etched, so that openings were formed in a contact region.

As a connection wiring, a titanium film (having a thickness of 50 nm), an aluminum film (having a thickness of 100 nm), and a titanium film (having a thickness of 5 nm) were stacked in this order by a sputtering method. The above stacked layer was selectively etched, whereby the wiring layer 565a and the wiring layer 565b were formed.

Through the above steps, the transistor 540 and the TEG 550 were formed.

By using the TEG 550 shown in FIG. 13, the sheet resistance of the oxide semiconductor layer 503 was measured. The measurement results of the sheet resistance are shown in FIG. 14.

Figure 14:
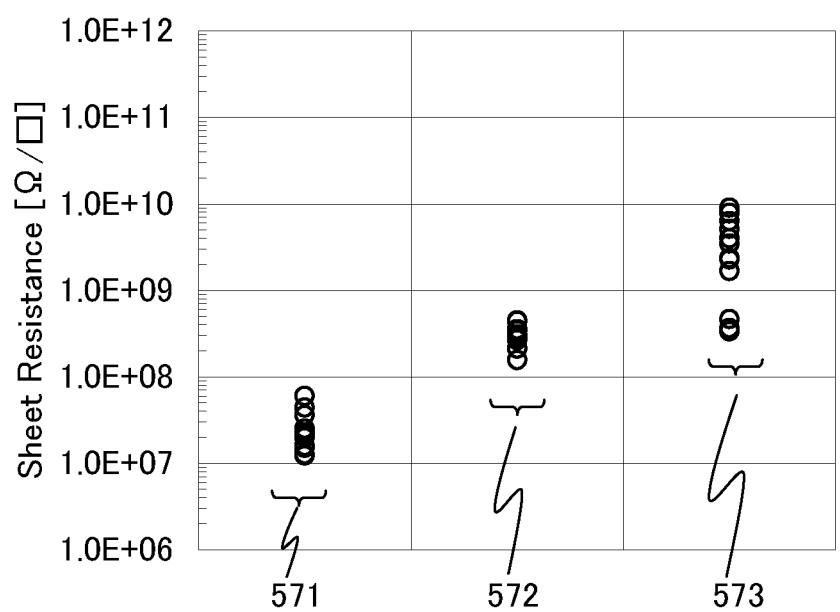
FIG. 14 shows the sheet resistance of an oxide semiconductor layer under an oxygen introduction condition.

In the graph of FIG. 14, the vertical axis shows the measurement results of the sheet resistance and the horizontal axis shows the respective conditions of the oxygen introduction. Note that plots 571, 572, and 573 shown in the horizontal axis correspond to the conditions of without oxygen introduction, oxygen introduction at a dose of $4.5 \times 10^{14}$ ions/cm$^2$, and oxygen introduction at a dose of $4.5 \times 10^{15}$ ions/cm$^2$ respectively. Each plot shows data of 13 TEGs for evaluating a sheet resistance formed over a glass substrate.

From the graph of FIG. 14, in the plot 571 under the condition of without oxygen introduction, the sheet resistance is $1.0 \times 10^7$ Ω/cm$^2$ to $1.7 \times 10^8$ Ω/cm$^2$. In the plot 572 under the condition of oxygen introduction at a dose of $4.5 \times 10^{14}$ ions/cm$^2$, the sheet resistance is $1.0 \times 10^8$ Ω/cm$^2$ to $1.0 \times 10^9$ Ω/cm$^2$. In the plot 573 under the condition of oxygen introduction at a dose of $4.5 \times 10^{15}$ ions/cm$^2$, the sheet resistance is $1.0 \times 10^8$ Ω/cm$^2$ to $1.0 \times 10^{10}$ Ω/cm$^2$.

As described above, it can be seen that when oxygen is introduced to the oxide semiconductor layer 503 through the gate insulating layer 567 which is an oxide insulating layer, the sheet resistance of the oxide semiconductor layer 503 is increased. In addition, it was confirmed that the sheet resistance of the oxide semiconductor layer 503 could be controlled by the concentration of introduced oxygen.

The above results show that when an oxide insulating layer (a gate insulating layer) is formed so as to be in contact with an oxide semiconductor layer, oxygen is introduced (oxygen introduction) through the oxide insulating layer, and heat treatment is performed, oxygen which is one of the main component of the oxide semiconductor can be supplied to the oxide semiconductor layer from the oxide insulating layer containing oxygen. Thus, the oxide semiconductor layer is more highly purified to be electrically i-type (intrinsic), and the sheet resistance of the oxide semiconductor layer is increased.

Consequently, a semiconductor device using an oxide semiconductor, which has high reliability and stable electric characteristics, can be provided.

This example can be implemented in combination with any of the structures described in the other embodiments as appropriate.

This application is based on Japanese Patent Application serial no. 2010-042024 filed with Japan Patent Office on Feb. 26, 2010, the entire contents of which are hereby incorporated by reference.

The invention claimed is:

1. A method for manufacturing a semiconductor device comprising the steps of:
    forming an oxide semiconductor layer;
    forming an oxide insulating layer so as to be in contact with the oxide semiconductor layer;
    after forming the oxide insulating layer, adding oxygen into the oxide semiconductor layer through the oxide insulating layer;
    after adding oxygen into the oxide semiconductor layer, performing first heat treatment on the oxide insulating layer and the oxide semiconductor layer;
    after performing the first heat treatment, forming an opening in the oxide insulating layer until a source electrode layer and a drain electrode layer are exposed; and
    after forming the opening in the oxide insulating layer, forming a conductive layer, wherein the conductive layer is directly connected to the source electrode layer and the drain electrode layer and is electrically connected to the oxide semiconductor layer through the opening of the oxide insulating layer.

2. The method for manufacturing a semiconductor device according to claim 1, wherein the step of adding oxygen is performed by irradiating the oxide semiconductor layer with an accelerated oxygen.

3. The method for manufacturing a semiconductor device according to claim 1, wherein the step of adding oxygen is performed by an ion implantation method or an ion doping method.

4. The method for manufacturing a semiconductor device according to claim 1, wherein the oxide insulating layer is a silicon oxide layer formed by a sputtering method.

5. The method for manufacturing a semiconductor device according to claim 1, further comprising the step of
forming the source electrode layer and the drain electrode layer between the oxide semiconductor layer and the oxide insulating layer.

6. The method for manufacturing a semiconductor device according to claim 1, wherein the oxide semiconductor layer comprises indium.

7. A method for manufacturing a semiconductor device comprising the steps of:
forming a first gate electrode layer over a substrate;
forming a gate insulating layer over the first gate electrode layer;
forming an oxide semiconductor layer over the gate insulating layer;
forming a source electrode layer and a drain electrode layer over the oxide semiconductor layer;
forming an oxide insulating layer over the oxide semiconductor layer, the source electrode layer, and the drain electrode layer, so as to be in contact with the oxide semiconductor layer;
after forming the oxide insulating layer, adding oxygen into the oxide semiconductor layer through the oxide insulating layer;
after adding oxygen into the oxide semiconductor layer, performing first heat treatment on the oxide insulating layer and the oxide semiconductor layer;
after performing the first heat treatment, forming an opening in the oxide insulating layer until the source electrode layer and the drain electrode layer are exposed; and
after forming the opening in the oxide insulating layer, forming a conductive layer, wherein the conductive layer is directly connected to the source electrode layer and the drain electrode layer and is electrically connected to the oxide semiconductor layer via the source electrode layer or the drain electrode layer through the opening of the oxide insulating layer.

8. The method for manufacturing a semiconductor device according to claim 7, wherein the step of adding oxygen is performed by irradiating the oxide semiconductor layer with an accelerated oxygen.

9. The method for manufacturing a semiconductor device according to claim 7, wherein the step of adding oxygen is performed by an ion implantation method or an ion doping method.

10. The method for manufacturing a semiconductor device according to claim 7, wherein the oxide insulating layer is a silicon oxide layer formed by a sputtering method.

11. The method for manufacturing a semiconductor device according to claim 7, further comprising the step of forming an insulating layer over the oxide insulating layer and the conductive layer,
wherein the insulating layer is a silicon nitride layer formed by a sputtering method.

12. The method for manufacturing a semiconductor device according to claim 7, wherein the oxide semiconductor layer comprises indium.

13. A method for manufacturing a semiconductor device comprising the steps of:
forming a gate electrode layer over a substrate;
forming a gate insulating layer over the gate electrode layer;
forming an oxide semiconductor layer over the gate insulating layer;
forming a source electrode layer and a drain electrode layer over the oxide semiconductor layer;
forming an oxide insulating layer over the oxide semiconductor layer, the source electrode layer, and the drain electrode layer, so as to be in contact with the oxide semiconductor layer;
after forming the oxide insulating layer, adding oxygen into the oxide semiconductor layer through the oxide insulating layer;
after adding oxygen into the oxide semiconductor layer, performing first heat treatment on the oxide insulating layer and the oxide semiconductor layer, whereby part of surfaces of the source electrode layer and the drain electrode layer is oxidized;
after performing the first heat treatment, forming an opening in the oxide insulating layer until a source electrode layer and a drain electrode layer are exposed; and
after forming the opening in the oxide insulating layer, forming a conductive layer, wherein the conductive layer is directly connected to the source electrode layer and the drain electrode layer and is electrically connected to the oxide semiconductor layer via the source electrode layer or the drain electrode layer through the opening of the oxide insulating layer.

14. The method for manufacturing a semiconductor device according to claim 13, wherein the step of adding oxygen is performed by irradiating the oxide semiconductor layer with an accelerated oxygen.

15. The method for manufacturing a semiconductor device according to claim 13, wherein the step of adding oxygen is performed by an ion implantation method or an ion doping method.

16. The method for manufacturing a semiconductor device according to claim 13, further comprising the step of forming an insulating layer over the oxide insulating layer and the conductive layer,
wherein the oxide insulating layer is a silicon oxide layer formed by a sputtering method.

17. The method for manufacturing a semiconductor device according to claim 13, wherein the oxide semiconductor layer comprises indium.

* * * * *